US006419499B1

(12) United States Patent
Bundza

(10) Patent No.: US 6,419,499 B1
(45) Date of Patent: Jul. 16, 2002

(54) APPARATUS FOR ELECTRONICALLY INTERCONNECTING ELECTRONIC CIRCUIT SUBSTRATES

(75) Inventor: Nicholas A. Bundza, Nepean (CA)

(73) Assignee: Alcatel Canada Inc. (CA)

( * ) Notice: Subject to any disclaimer, the term of this patent is extended or adjusted under 35 U.S.C. 154(b) by 0 days.

(21) Appl. No.: 09/629,404

(22) Filed: Aug. 1, 2000

(51) Int. Cl.[7] ............................. H01R 12/00; H05K 1/00
(52) U.S. Cl. ............................. 439/61; 439/64; 439/65; 439/377
(58) Field of Search ............................. 439/65, 61, 377, 439/260, 64; 361/684, 726, 797

(56) References Cited

U.S. PATENT DOCUMENTS

| | | | | |
|---|---|---|---|---|
| 4,550,362 A | * | 10/1985 | Reimer | 361/801 |
| 6,059,610 A | * | 5/2000 | Chu | 439/377 |
| 6,071,143 A | * | 6/2000 | Barthel et al. | 439/377 |

OTHER PUBLICATIONS

"36170 MainStreet ATMnet Backbone Switch: General Information, Release 1.3, Generic A21111", Newbridge Networks Corporation, 1996.

"Product Overview and Installation, Newbridge 350 Integrated Versatile Services Node, Technical Practices, Release 1.0", Newbridge Networks Corporation, Mar. 2000.

* cited by examiner

Primary Examiner—Gary Paumen
Assistant Examiner—Felix D. Figueroa
(74) Attorney, Agent, or Firm—Townsend and Townsend and Crew LLP

(57) ABSTRACT

There is provided an adapter for electrically interconnecting a first circuit substrate with a second circuit substrate. The adapter includes a first electrical connector which is operatively connected to the first circuit substrate. The first electrical connector mates with a corresponding second electrical connector which is operatively connected to the second circuit substrate. A longitudinal guide is provided with the adapter for receiving an edge of one of the first circuit substrate and the second circuit substrate. The longitudinal guide is positioned such that when the edge of one of the first circuit substrate and the second circuit substrate is received therein, relative translation of the first circuit substrate with respect to the second circuit substrate directs the first electrical connector and the second electrical connector together to thereby provide electrical engagement therebetween. The adapter would permit a first existing circuit substrate of given dimensions to be housed in an equipment enclosure intended for a second existing circuit substrate of larger dimensions than the first existing circuit substrate.

37 Claims, 20 Drawing Sheets

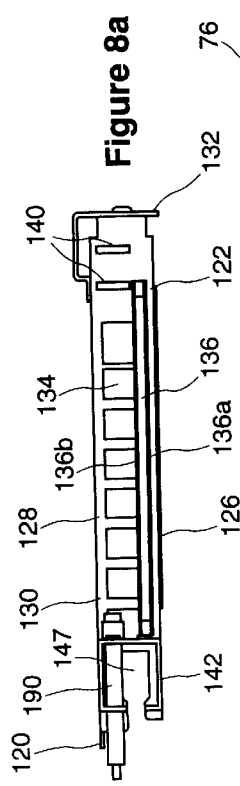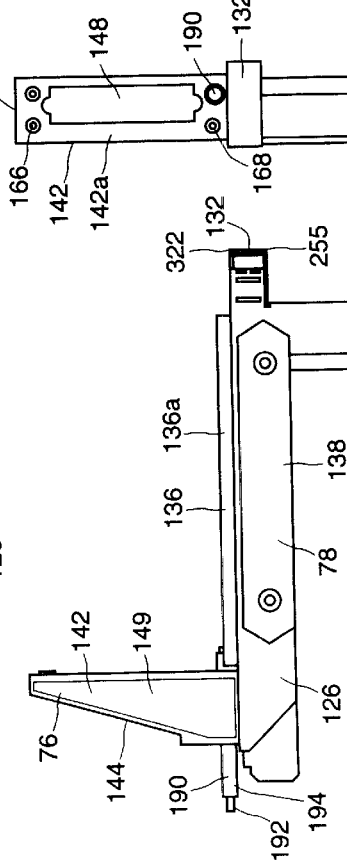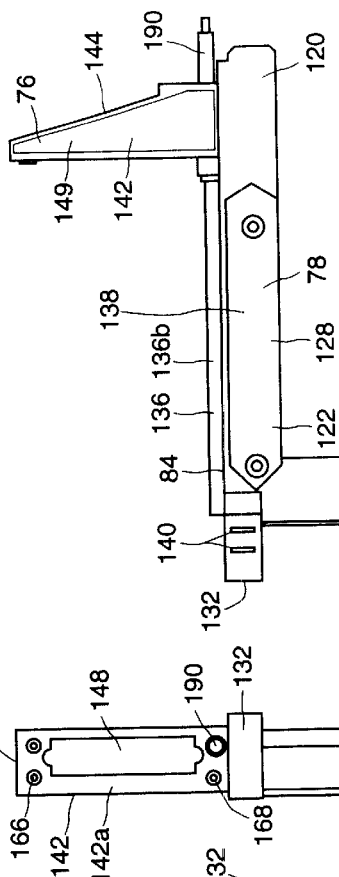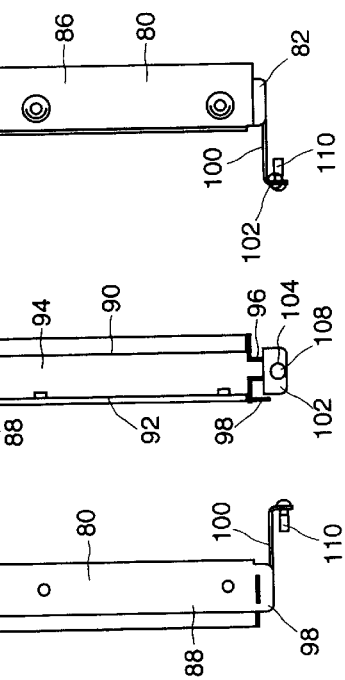

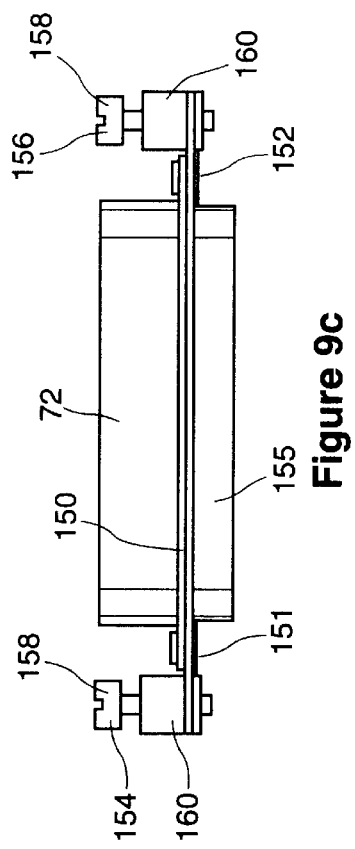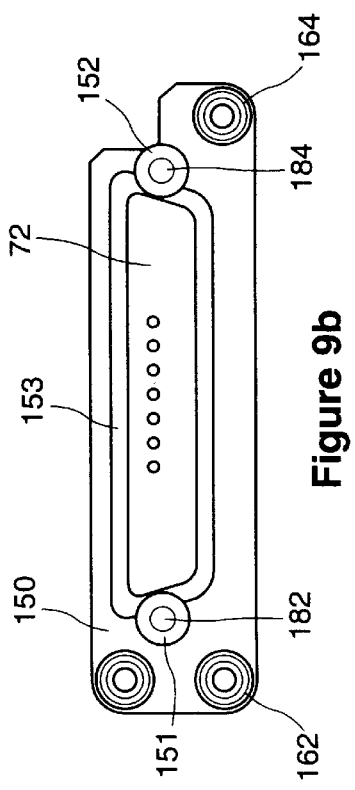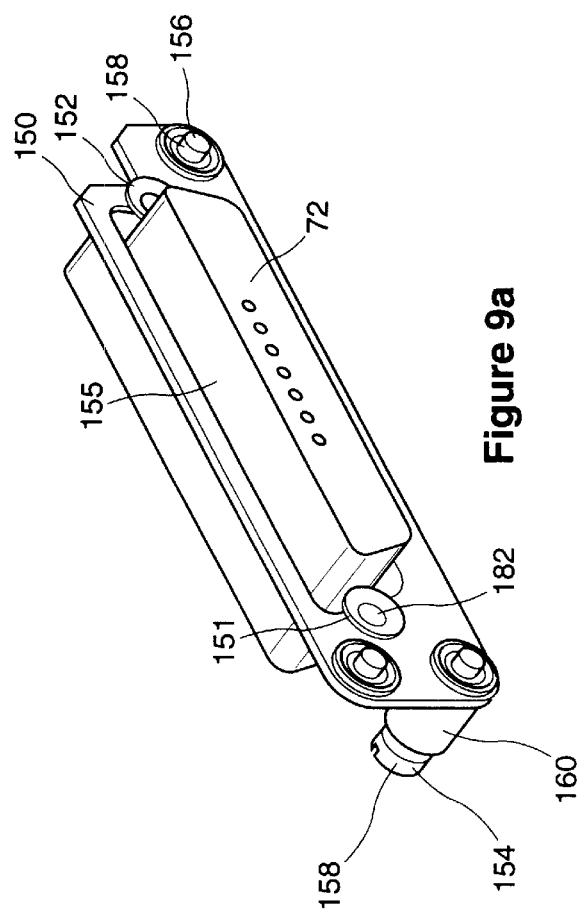

APPARATUS FOR ELECTRONICALLY INTERCONNECTING ELECTRONIC CIRCUIT SUBSTRATES

FIELD OF INVENTION

The present invention relates generally to the field of electronics and more particularly, to an apparatus for interconnecting electronic circuitry units to each other.

BACKGROUND OF THE INVENTION

Electronic equipment conventionally comprises an enclosure such as a box-shaped housing containing electronic circuitry. In some instances, a face of such a housing is open so as to provide access to shelves, each of which may be configured with receiving stations for holding electronic circuitry units or circuit packs in a side-by-side relationship. Typically, such units comprise at least one circuit substrate such as a printed circuit board or card carrying a plurality of electrical components. When installed into such a housing, one or more of these units may be connected to electrical connectors mounted within the housing. Each of the electronic circuitry units may provide particularized or dedicated functionality for the end user, and this may permit the user to configure a given housing in a modular or customized manner.

In certain types of electrical equipment, for instance in telecommunications networking equipment, it has been found that port density and functionality may be increased if electronic circuitry units are provided with larger printed circuit board areas, Such units could be accommodated in a modified housing having a larger shelf configuration. One way to achieve this result is to construct a single unit having larger printed circuit board dimensions. However, this approach may typically result in rendering pre-existing equipment obsolete, since an end user with legacy equipment having smaller printed circuit board dimensions will generally not be capable of utilizing legacy electronic circuitry units of smaller dimensions in conjunction with equipment enclosures intended for electronic circuitry units of larger dimensions.

In other types of electronic equipment, it would be desirable to have a mechanism that would permit two or more circuit substrates such as printed circuit boards to be releasably interconnected together. Such an arrangement would allow for various configurations of printed circuit boards to be interchanged with each other in a given enclosure therefor.

It is therefore an object of the present invention to provide a circuit substrate which would permit a first existing circuit substrate of given dimensions to be housed in an equipment enclosure intended for a second existing circuit substrate of larger dimensions than the first existing circuit substrate.

It is another object of the present invention to provide a mechanism which would permit two or more circuit substrates to be releasably interconnected together.

These and other objects of the present invention will be made apparent by way of the description of the invention which follows.

SUMMARY OF THE INVENTION

According to a broad aspect of the present invention, there is provided an apparatus for electrically interconnecting a first circuit substrate with a second circuit substrate, the apparatus comprising: a first electrical connector which is operatively connected to the first circuit substrate, the first electrical connector mating with a corresponding second electrical connector therefor which is operatively connected to the second circuit substrate; a longitudinal guide for receiving a first edge of one of the first circuit substrate and the second circuit substrate, said longitudinal guide being positioned adjacent another edge of another one of the first circuit substrate and the second circuit substrate and extending therealong in a direction substantially parallel thereto, such that said first edge and said another edge are not located on a same substrate of said first circuit substrate and said second circuit substrate; and wherein when said first edge of said one of the first circuit substrate and the second circuit substrate is received therein, relative translation of the first circuit substrate with respect to the second circuit substrate directs the first electrical connector and the second electrical connector together to thereby provide electrical engagement therebetween.

One illustrative application of the present invention entails using an existing printed circuit board or "legacy" card, designed for a smaller shelf configuration, with a larger shelf configuration. In this application, a spacer card which attaches to the legacy card is used to increase the overall printed circuit board area of same so that the combined dimensions of the legacy card and a spacer card conform to those of the larger shelf configuration. In the illustrative arrangement, the spacer card has an adapter that allows for insertion of the legacy card into the larger shelf configuration while also permitting electrical connection between the legacy card and the spacer card. This adapter allows the larger shelf configuration to support the legacy card and thus permits the legacy card to be mechanically and electrically compatible with an equipment housing of larger dimensions.

BRIEF DESCRIPTION OF THE DRAWINGS

For a better understanding of the present invention and to show more clearly how it may be carried into effect, reference is now made, by way of example and not of limitation, to the accompanying drawings in which:

FIG. 8a is a first end view of the chassis of FIG. 7;

FIG. 8b is a first elevational view of the chassis of FIG. 7;

FIG. 8c is a second end view of the chassis of FIG. 7, taken in a direction transverse to the first end view thereof of FIG. 8a;

FIG. 8d is a second elevational view of the chassis of FIG. 7, taken in a direction opposite to the first elevational view thereof of FIG. 8b;

FIG. 9a is a perspective view of a mounting plate used to attach an electrical connector to the chassis of the adapter shown in the installation of FIGS. 1 and 4;

FIG. 9b is a plan view of the mounting plate of FIG. 9a;

FIG. 9c is an elevational view of the mounting plate of FIG. 9a;

FIG. 15a is a partially exploded, perspective view of a card of the first card assembly being assembled to the adapter shown in the installation of FIGS. 1 and 4;

FIG. 15b is a partially exploded, perspective view of a faceplate being assembled to the card of FIG. 15a;

DETAILED DESCRIPTION OF ILLUSTRATIVE EMBODIMENTS OF THE INVENTION

Figure 1:
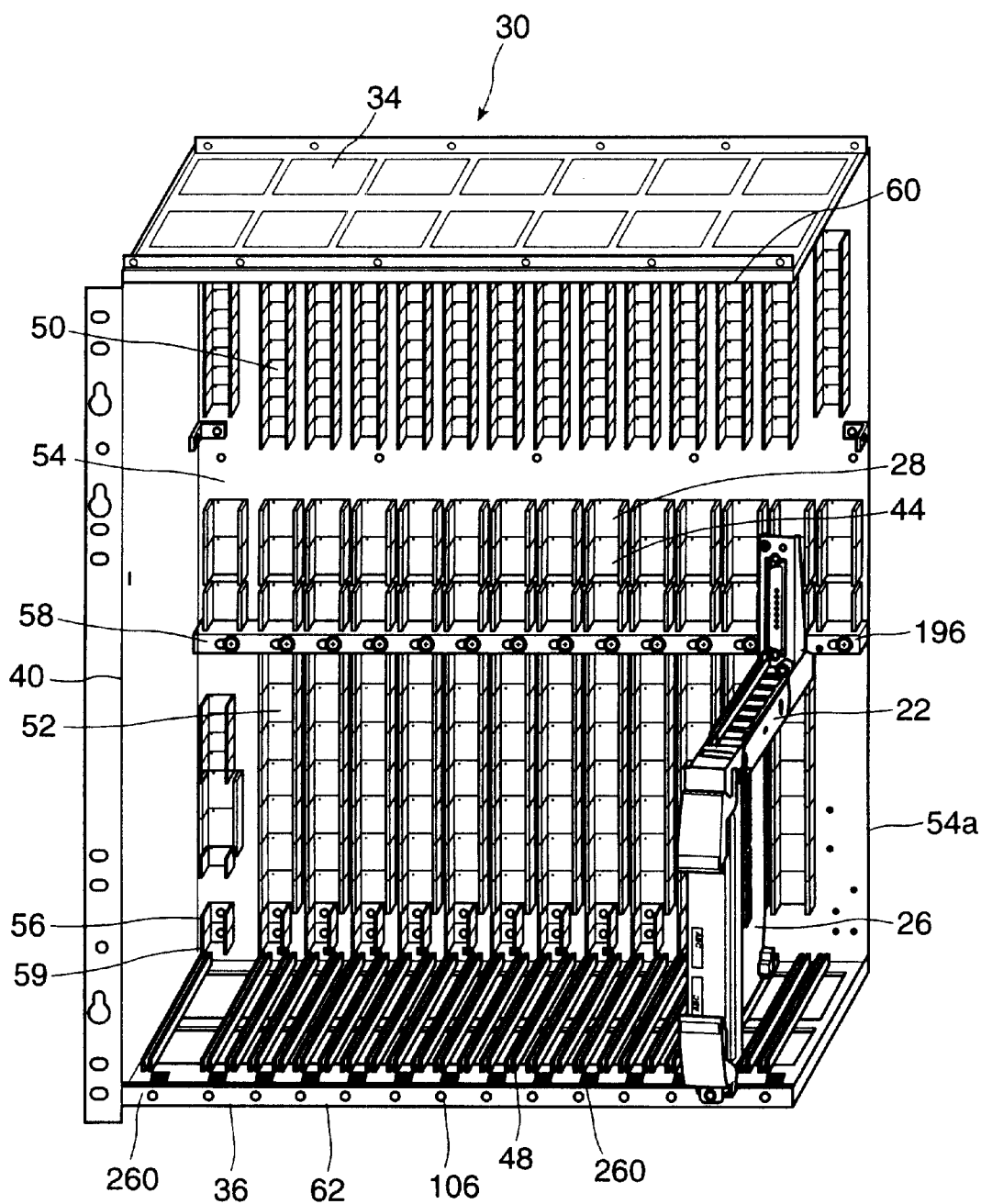
FIG. 1 is a perspective view of a typical installation of an adapter according to an illustrative embodiment of the invention, showing a first card assembly mounted to the adapter, and installed within a shelf of an equipment housing (a panel adjacent the first card assembly having been removed from the housing for sake of clarity)
Figure 2:
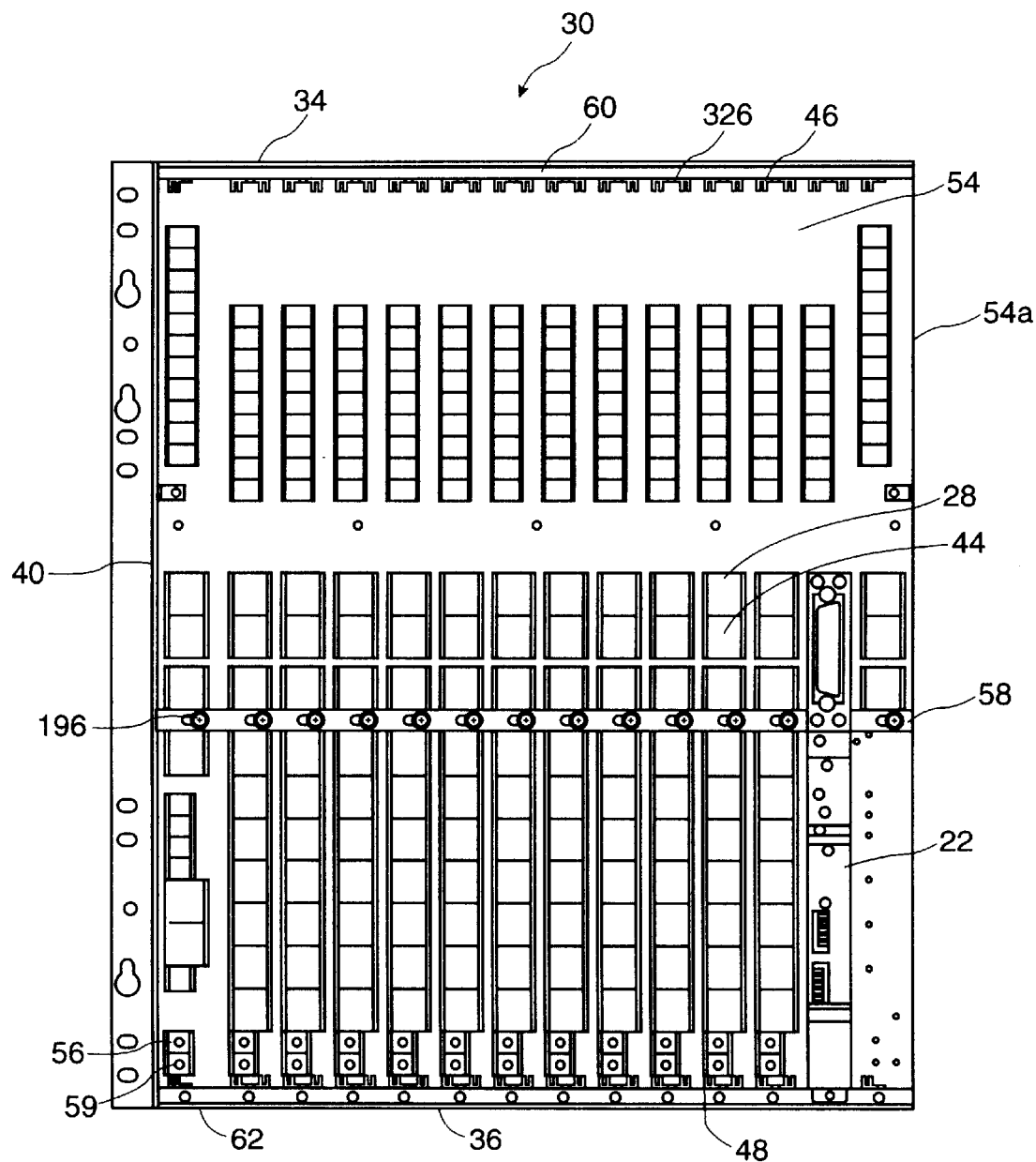
FIG. 2 is an elevational view of the installation according to FIG. 1, showing the first card assembly in an edge view thereof.
Figure 3:
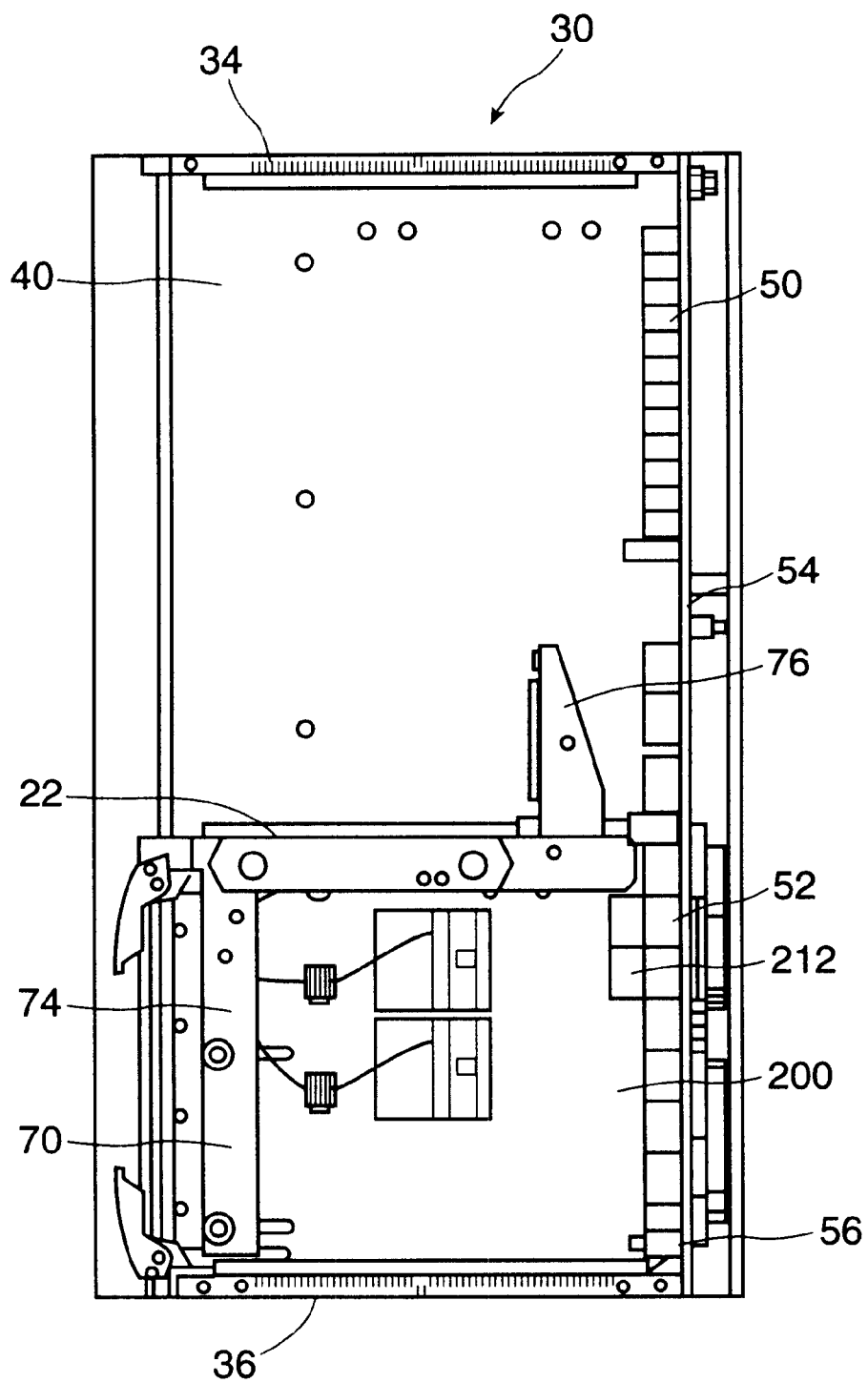
FIG. 3 is another elevational view of the installation according to FIG. 1, showing the adapter in a plan view thereof.

The description which follows, and the embodiments described therein, are provided by way of illustration of an example or examples of particular embodiments which reflect the principles of the present invention. These examples are provided for the purposes of explanation, and not of limitation, of those principles and of the invention. In the description which follows, like parts are marked throughout the specification and the drawings with the same respective reference numerals.

Figure 4:
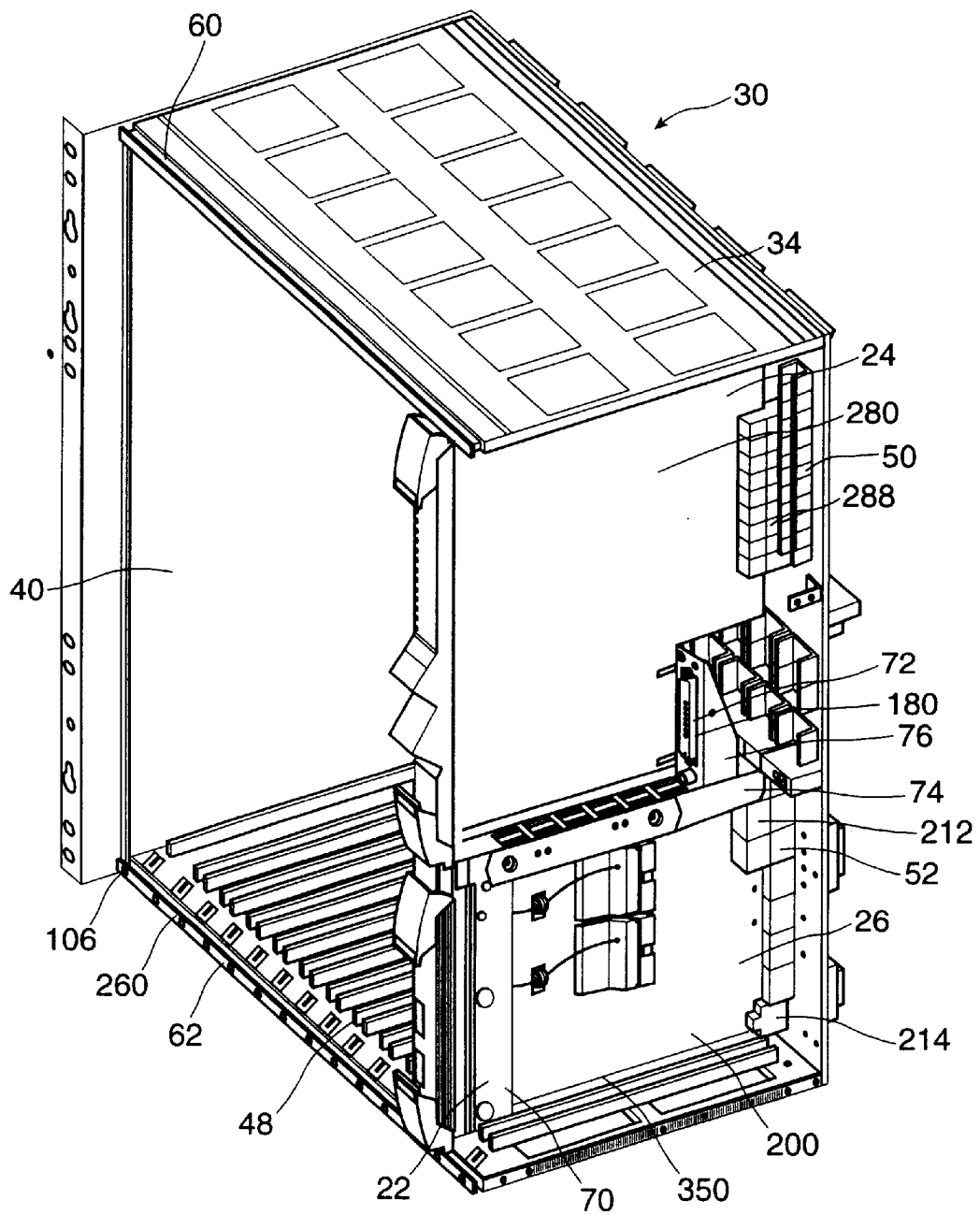
FIG. 4 is another perspective view of the adapter of the installation according to FIG. 1, showing the first card assembly together with a second card assembly mounted thereto, each said assembly being installed within the shelf of the housing.
Figure 5:
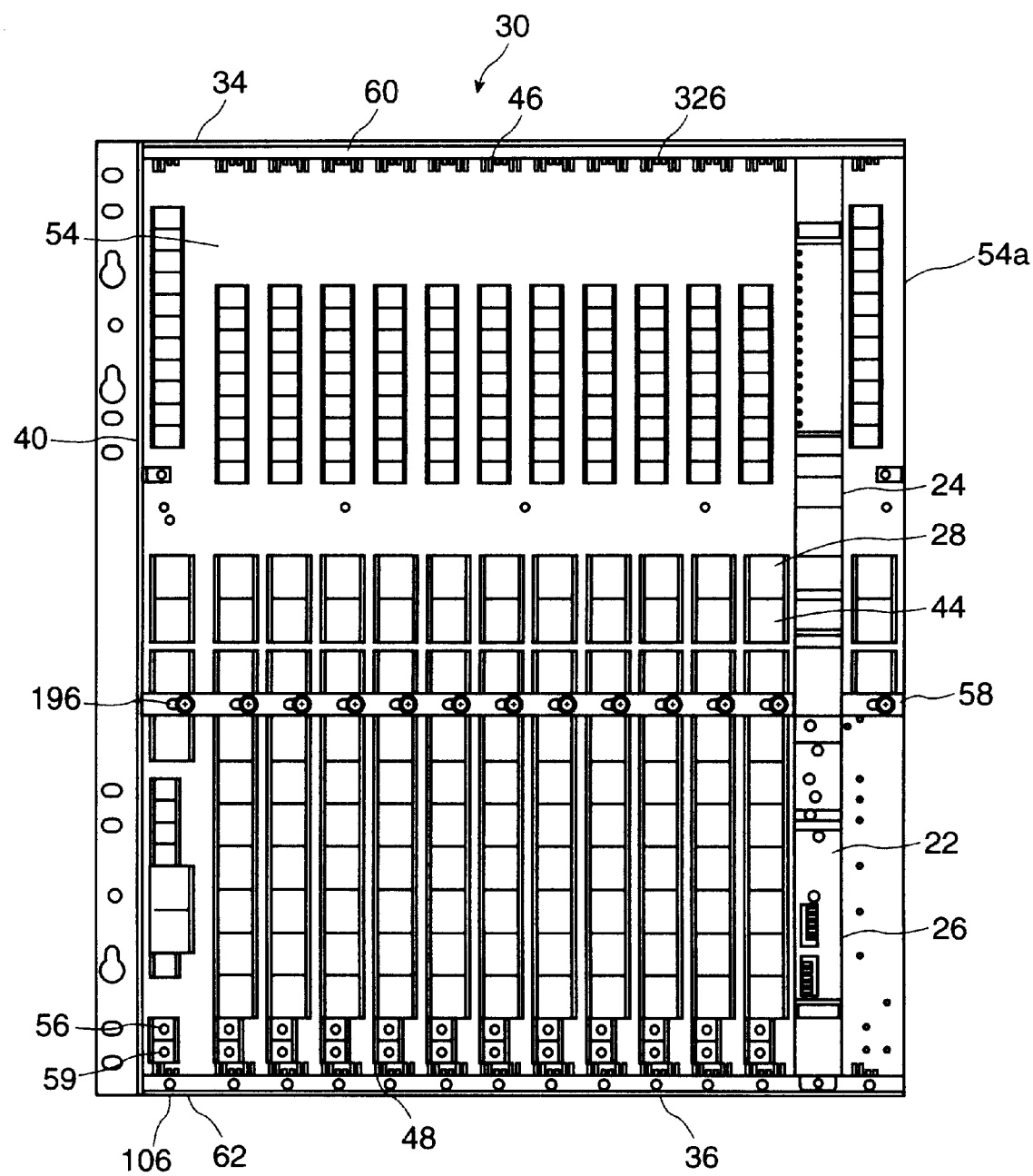
FIG. 5 is an elevational view of the installation according to FIG. 4, showing the first and second card assemblies in respective edge views thereof.
Figure 6:
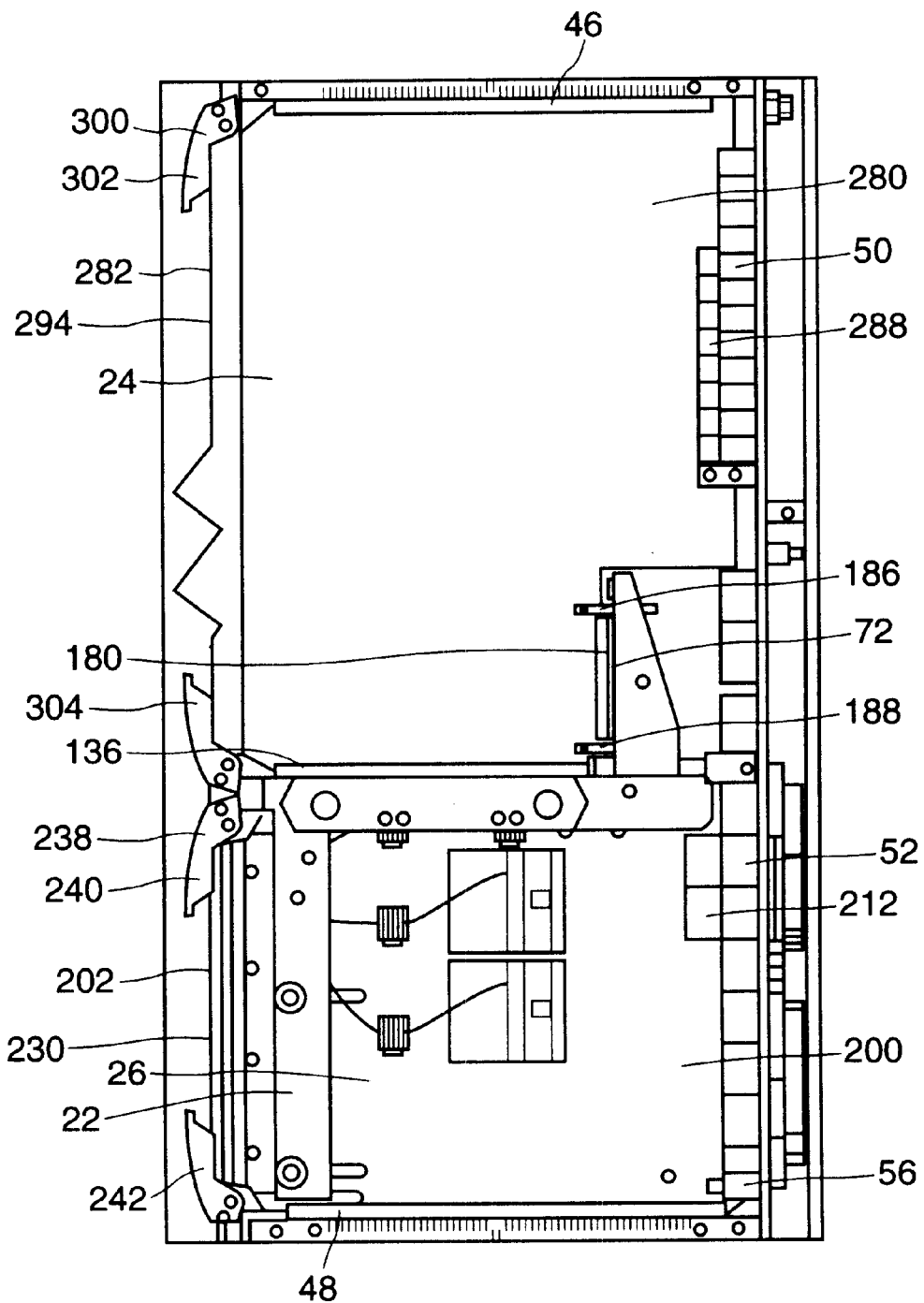
FIG. 6 is another elevational view of the installation according to FIG. 4, showing the first and second assemblies in respective plan views thereof.

Referring to FIGS. 1 and 4, an apparatus in the form of an adapter 22 is used to install two circuit substrates or electronic circuitry units, such as first and second printed circuit board or card assemblies 24 and 26, in a receiving station 28 therefor defined within an equipment housing 30.

Housing 30 may be of the type used in telecommunications switching equipment. Referring to FIGS. 1 to 6, housing 30 is a generally rectangular enclosure that has outer panels 34, 36 and 40. Each of the outer panels 34, 36 and 40 is attached to a backplane 54, which is described in further detail below. An additional outer panel (not shown) extends from the backplane 54 as at edge 54a thereof The housing 30 is open at one face thereof to provide access to one or more receiving stations 28 in the form of shelves 44. Each shelf 44 comprises, in the conventional fashion, a set of first and second longitudinal guides 46, 48 which are generally disposed in opposed relation to one another.

In the illustrative embodiment, each opposed pair of guides 46, 48 are generally coplanar and each shelf measures approximately 20 inches from first guide 46 to second guide 48. First and second guides 46 and 48 extend in a direction generally transverse to backplane 54 of housing 30 and serve to direct the insertion of card assemblies 24 and 26 into backplane 54, as will be described in greater detail below. Once inserted, card assemblies 24 and 26 electrically interconnect with electrical connectors 50 and 52, respectively, which may be provided in backplane 54. Electrical connectors 50 and 52 may be pin-type connectors with press fit headers. In addition, backplane 54 may have connectors 56 in the form of power pins 59. Pins 59 provide an electrical ground or EDG (Energy Dumping Ground) to adapter 22 once mated therewith to prevent surges of static electricity.

Backplane 54 also has a stiffener member or bar 58 which extends across the center of backplane 54 and tends to discourage deflection therein so that proper electrical connection may be achieved with card assemblies 24 and 26. Stiffener bar 58 also serves an alignment function and provides a fastening point for adapter 22, as will be more fully described below. Housing 30 also has a first cross-member 60 and a second cross-member 62 which extend between the free terminal edges of two opposed outer panels, for instance the outer panels 34 and 36. Cross-members 60 and 62 provide attachment sites to which adapter 22 and card assemblies 24 and 26 may be fastened during installation thereof into housing 30, Adapter 22 may comprise a translatable member which in the illustrative embodiment takes the form of an adapter frame or chassis 70 for holding card assembly 26. Adapter 22 further comprises an electrical connector 72 which may be attached to a fame or chassis 70 for electrically interconnecting card assemblies 24 and 26. Referring now to FIGS. 7 and 8a to 8d, the main structural components of chassis 70 are bracket or angle member 74 and mounting arm 76. Bracket 74 has a first leg 78 and a second leg 80.

First leg 78 of bracket 74 has a distal or free end 120 and a proximal end 122. Proximal end 122 of first leg 78 meets proximal end 84 of second leg 80 to thereby join first leg 78 to second leg 80. First leg 78 has a channel 124 that extends between proximal end 122 and fire end 120 thereof Channel 124 has opposed walls 126 and 128 which are joined together by a web 130, Web 130 extends beyond proximal end 122 of first leg 78 to terminate with an end plate 132 transversely disposed thereto. Cut-outs 134 are provided along web 130 for enhancing airflow between card assemblies 24 and 26 within shelf 44, as shown in FIG. 8a. First leg 78 also has a guide 136 which is mounted to web 130. Guide 136 cooperates with a corresponding guide 46 to direct the, insertion of card assembly 24 within shelf 44. Guide 136 may consist of two substantially parallel strips 136a and 136b extending generally perpendicularly from the surface of web 130 to thereby form a channel-shaped construction. First leg 78 is also provided with spacer members 138, each of which is fixed respectively to channel walls 126 and 128, as shown in FIGS. 8b and 8d. Spacer members 138 function as stand-offs or bumpers to maintain adequate spacing between respective adapters 22 mounted in adjacent shelves 44. Spacer members 138 also function as insulators and may be made of a plastic or of some other non-conductive material.

Second leg 80 of bracket 74 has a distal or fee end 82 and a proximal end 84 located on a longitudinal axis 85. Opposed and generally parallel panels 86 and 88 extend from free end 82 to proximal end 84 of second leg 80 to join with first leg 78. Each panel 86 and 88 has a lip 90 and 92, respectively, which curls inwardly towards the opposite panel 86 or 88, as the case may be. Lips 90 and 92 defile a generally rectangular aperture 94 located transversely of and between panels 86 and 88 through which card assembly 26 extends once mounted to adapter 22, as best shown in FIG. 51c.

Panels 86 and 88 of second leg 80 may be joined to each other at free end 82 thereof by a transverse member such as a corrugated member 96 formed integrally with panel 86. Panel 88 has an edge or foot 98 that extends longitudinally beyond corrugated member 96. Foot 98 abuts the bottom of shelf 44 during insertion of adapter 22 into shelf 44. A projection 100 extends from corrugated member 96 to terminate in a lip 102, as best shown in FIGS. 8b and 8d, When adapter 22 is mounted within shelf 44, lip 102 abuts against cross-member 62. Openings 104 and 106 respectively provided within lip 102 and cross-member 62 are located to receive a threaded fastener 108, such as a screw 110, to secure adapter 22 to housing 30.

Electro-magnetic interference (EMI) contacts, in the form of fingers, springs or gaskets, generally indicated as 140 and shown in FIGS. 8a, 8b and 8d, are mounted on bracket 74 to ensure that electrical continuity is maintained between adjacent shelves 44. As well, the positioning of contacts 140 promotes electrical continuity among the card assemblies 24 and 26 and adapter 22. Contacts 140 are resilient to allow them to be forced up against the abutting surfaces of card assemblies 24 and 26 with adjacent adapters 22 to maximize contact therebetween. Contacts 140 are typically made of copper but can be constructed from other conductive materials, as those skilled in the art will appreciate.

Figure 7:
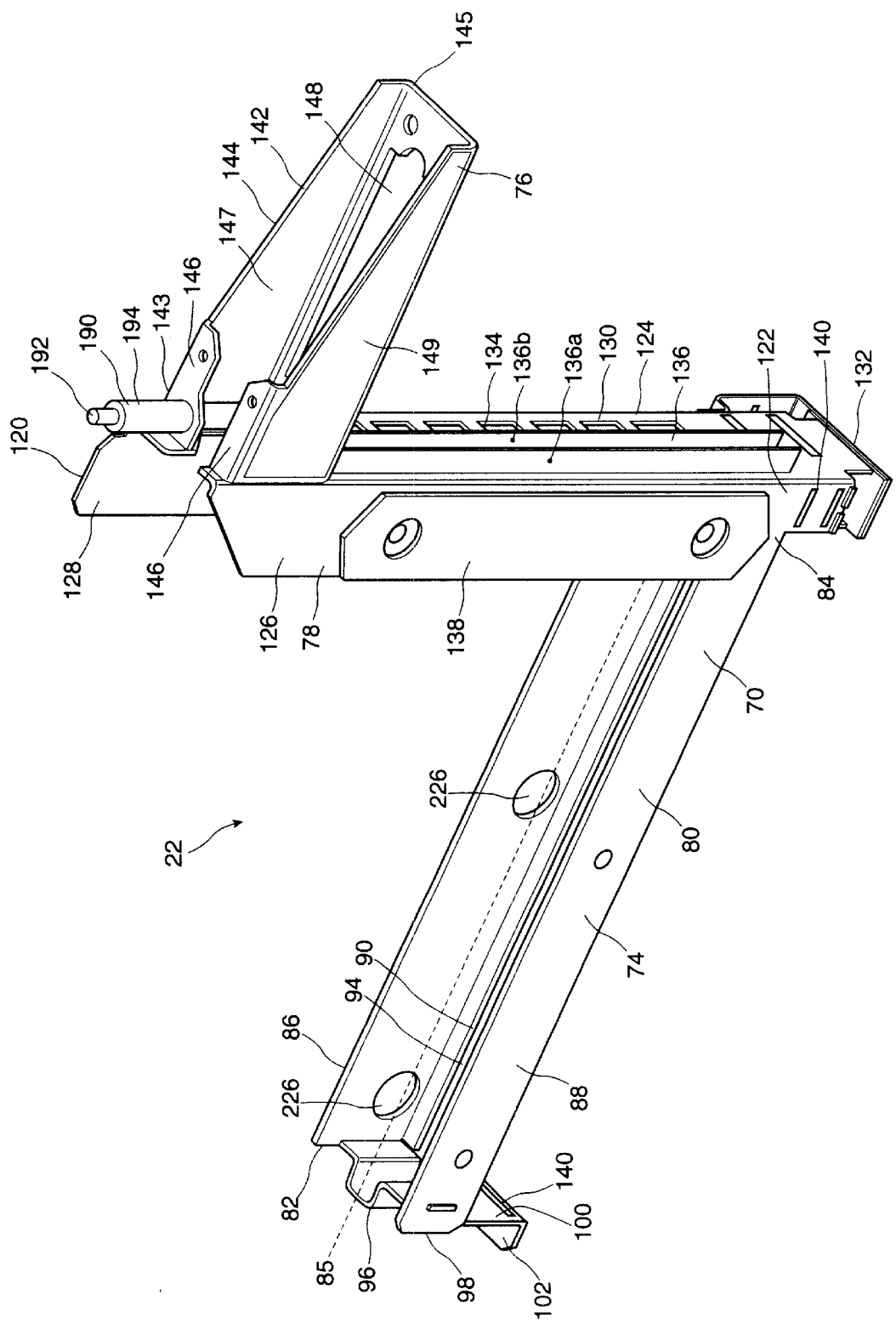
FIG. 7 is a perspective view of a chassis of the adapter shown in the installation according to FIGS. 1 and 4.
Figure 10:
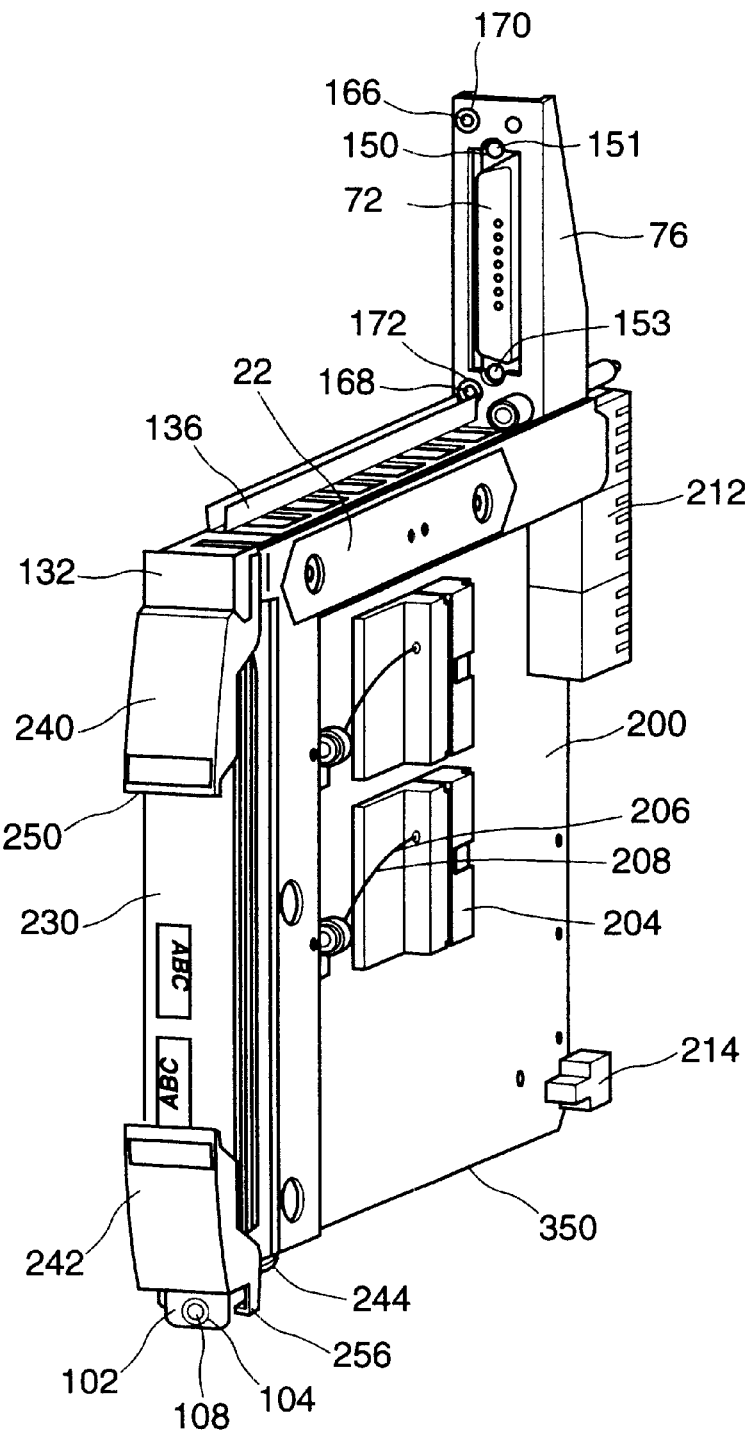
FIG. 10 is a perspective view of the first card assembly mounted to the adapter shown in the installation of FIGS. 1 and 4.
Figure 11:
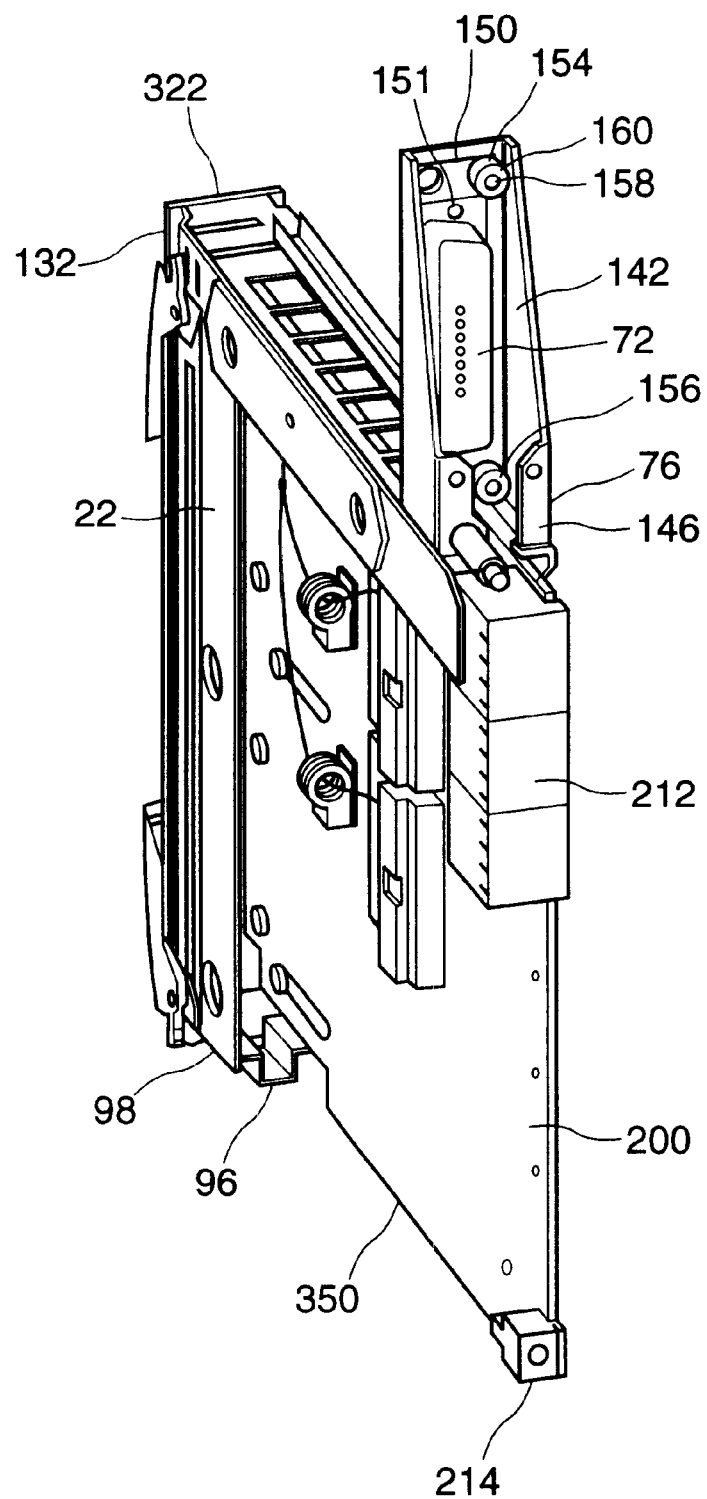
FIG. 11 is another perspective view of the first card assembly mounted to the adapter shown in the installation of FIGS. 1 and 4, taken from a direction generally opposite to that FIG. 10.
Figure 12:
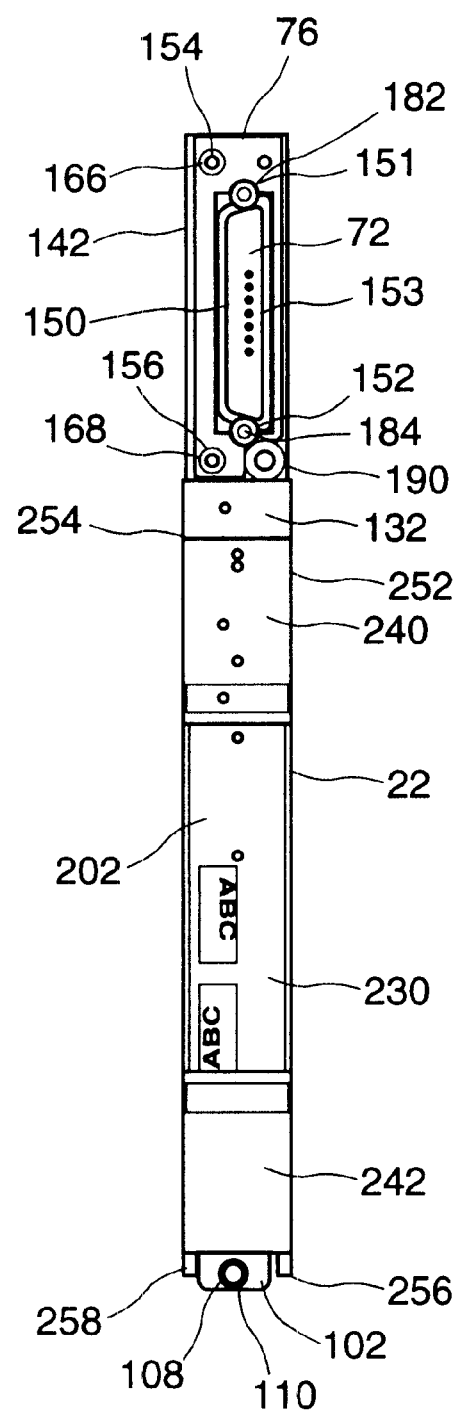
FIG. 12 is an edge view of the first card assembly and adapter of FIG. 10.

A mounting arm 76 is mounted to first leg 78 at a location adjacent free end 120 thereof, and extends generally perpendicular to web 130. Mounting arm 76 has a channel member 142 which houses an electrical connector 72, as shown in FIG. 10. Channel member 142 has a proximal end 143 that joins to web 130, and a free end 145. At its proximal end 143, channel member 142 has overhanging flanges 146. Generally mid-way between proximal end 143 and free end 145, the overhanging flanges 146 have been removed and a cut-out portion 144 of channel member 142 is provided to define a space 147 for receiving electrical connector 72, as shown in FIG. 7. When installed in space 147, electrical connector 72 projects through an aperture 148 provided in channel member 142 toward proximal end 122, as best seen in FIG. 10, Electrical insulating strips 149 may be affixed to mounting arm 76 to insulate electrical connector 72. Although, in the illustrative embodiment, insulating strips 149 may be made of polyamid, it will be understood by those versed in this art that other insulative materials or insulating techniques for mounting am 76 and electrical connector 72 may also be used.

Referring to FIGS. 9a to 9c and FIGS. 10 to 12, electrical connector 72 may be attached to mounting arm 76 by means of mounting plate 150 to which electrical connector 72 is secured by rivets 151 and 152 or by other suitable fasteners. An opening 153 within mounting plate 150 permits a portion 155 of electrical connector 72 to project beyond the plate of the plate. Mounting plate 150 may be attached to channel member 142 by two threaded fasteners 154 and 156 or by other like means. Each threaded fastener 154 and 156 has a bolt 158 and a spacer 160. Bolts 158 ate received through openings 162 and 164 in mounting plate 150, and corresponding openings 166 and 168 in channel member 142. Openings 166 and 168 have threaded bushings 170 and 172 mounted thereabout to engage threads of bolts 158. The size of openings 162 and 164 is greater than the diameter of bolts 158, such that when mounting plate 150 is secured to mounting arm 76, the former maybe afforded some preselected degree of movement relative to the latter.

The foregoing arrangement tends to allow electrical connector 72 to float within mounting arm 76. As a result, minor manufacturing or assembly tolerances may be overcome to allow electrical connector 72 and corresponding electrical connector 180 of card assembly 24 to be in proper alignment for mating one to the other. In this way, the floating nature of electrical connector 72 may tend to reduce the risk of either connector 72 or 180 being damaged (for example, connector pins being bent) as a result of attempts to mate misaligned connectors. Mounting plate 150 also has a second pair of through openings 182 and 184 positioned on each side of larger opening 153 and defined longitudinally within rivets 151 and 152 to receive guide pin 186 and 188 of connector 180 of card assembly 24.

Mounting arm 76 also has a locating mechanism such as an alignment member 190 which extends transversely of channel member 142, and is generally parallel to web 130. Alignment member 190 is mounted to extend trough channel member 142 and is supported by one of overhanging flanges 146 and an opposed wall 142a (FIG. 8c) of channel member 142. Alignment member 190 comprises a threaded pin or fastener 192, such as a screw or bolt, and a housing therefor such as a sleeve or bushing 194, as shown in FIGS. 8a through 8d. Fastener 192 is captive within bushing 194, but is free to move axially relative to bushing 194. Alignment member 190 aligns adapter 22 for installation within shelf 44, As will be explained in greater detail below, the proper alignment of adapter 22 within shelf 44 facilitates insertion of card assembly 26 into backplane 54, An opening 196 within backplane stiffening member 58 is located to receive alignment member 190, and more specifically, bushing 194. Once bushing 194 is engaged within opening 196, fastener 192 is secured to stiffening member 58. In this way, alignment member serves the dual purpose of aligning adapter 22 within shelf 44 and securing adapter 22 in that position.

Referring to FIGS. 10 to 13, card assembly 26 comprises a printed circuit board or card 200 and a faceplate 202. Card 200 may be generally rectangular in shape and it carries one or more electronic components 204 that are connected to electrical connector 72 by electrical conductors 206, such as wires or cables 208. Cable ties 210 which may be tightened about cables 208 may be used to gather cables 208, Card 200 also has an input/output (I/O) port 212 and an electrical connector 214 mounted along an edge thereof for electrical interconnection to electrical connectors 52 and 56, respectively, of backplane 54.

Card 200 is provided with a series of slots 220. Slots 220 serve as attachment sites for attaching card 200 to bracket 74. Fasteners 222 such as shoulder screws 224 are used to secure card 200 to bracket 74. Card 200 is mounted between panels 86 and 88 of second leg 80, and within channel 124 of first leg 78. Apertures generally indicated as at 226 are defined within panel 86 and channel wall 128 to allow access to slots 220 for the fastening of card 200 to panel 88 and channel wall 126. Some tolerance maybe afforded in the attachment of card 200 such that card 200 can move within bracket 74 in a direction transverse of the plane of card 200. Slots 220 also allow card 200 to translate relative to adapter chassis 70, in a direction parallel to first leg 78, such translation being limited by the length of the slots. The configuration of card 200 may also limit its translation relative to adapter chassis 70, as will be explained below.

Figure 13:
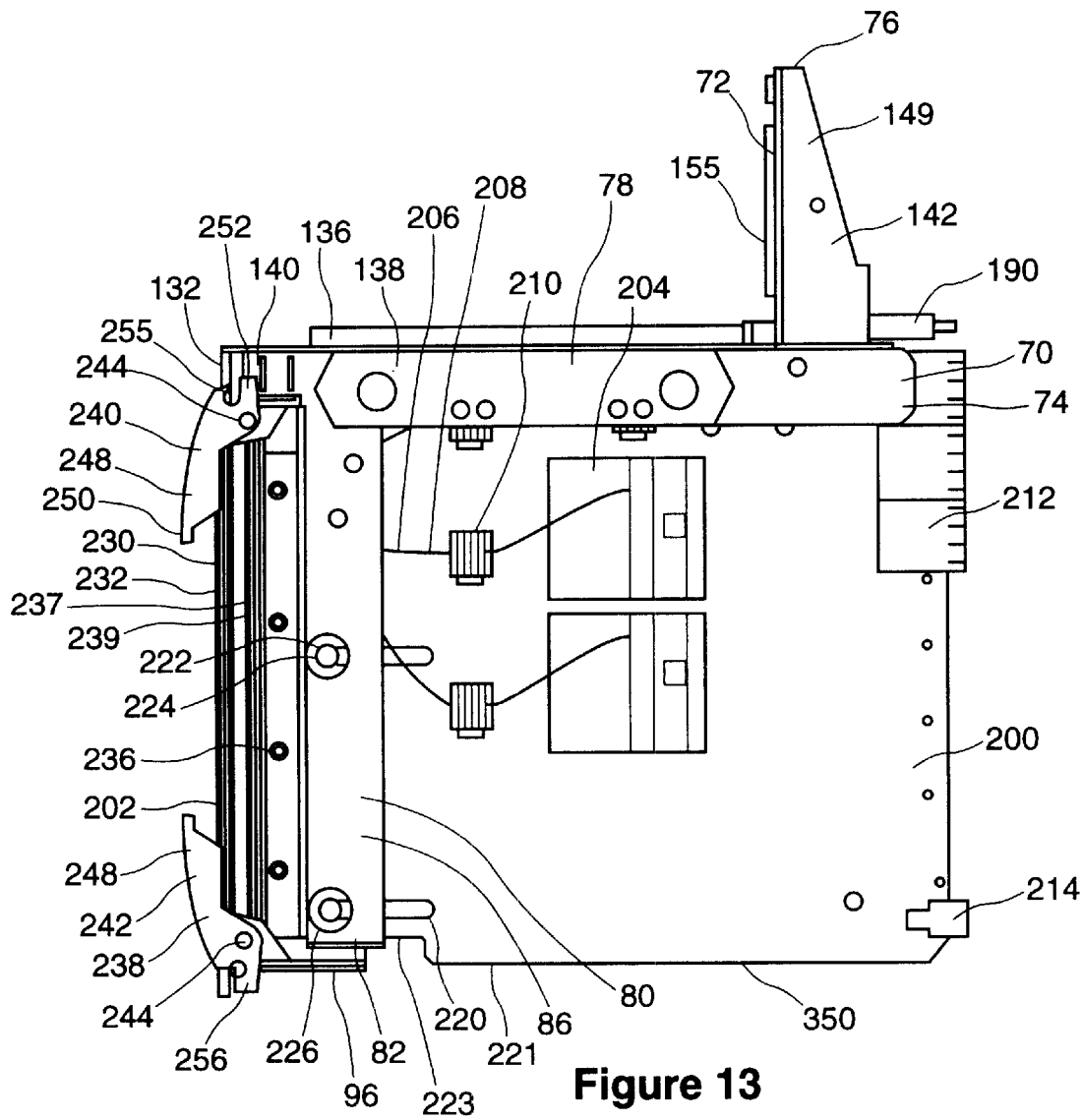
FIG. 13 is a plan view of the first card assembly and adapter of FIG. 10.

Referring to FIG. 13, card 200 has edges 221 that are substantially parallel to slots 220. Rebates 223 effectively reduce the width card 200 as measured from one edge 221 to the other edge 221 to allow card 200 to be received within aperture 94 and translate relative to bracket 74 to a predetermined extent. Beyond rebates 223, the width of card 200 as measured between edges 221 becomes greater than that which can be accommodated in aperture 94. Consequently, when card 200 is urged through aperture 94 away from mounting arm 76, the edge 221 located nearest free end 82 of second leg 80 abuts against corrugated member 96 and effectively acts as a stop, thereby preventing card 200 from moving any further away from mounting arm 76.

A transverse web such as faceplate 202 may be provided adjacent an edge of card 200 that is proximate to and substantially parallel with second leg 90 of bracket 74. Faceplate 202 provides an interface between card 200 and housing 30, as will be explained below. Faceplate 202 has a longitudinal panel 230 with flange members 232 and 234 extending transversely thereof, Flange member 234 provides an attachment site for locating fasteners 236 which are used to secure card 200 to faceplate 202. Faceplate 202 also has an electro-magnetic interference (EMI) member 237 mounted to flange member 232. EMI member 237 may be in the form of a soft shield EMI gasket 239 made of electrical conductive fabric, Gasket 239 ensures electrical continuity among the various adapters 22 and faceplates 202 mounted in adjacent shelves 44, as is known in the art.

Faceplate 202 also provides a pair of card insertion actuators or card electors 238, such as levers 240 and 242, mounted at each terminal end of panel 230. Levers 240 and 242 can be made to pivot about an axis 244 that is generally perpendicular to flange member 234, and levers 240 and 242 are moveable between an open position 246 (shown in FIG. 14) and a closed position 248 (shown in FIG. 13). Each lever 240 and 242 has a distal or free end 250 that can be grasped to actuate lever 240 and 242, as the case may be. Each lever 240 and 242 also has a pair of spaced-apart tabs 252, 254 and 256, 258, respectively, which are located at an end thereof opposite to free end 250. In the respective open positions 246 of levers 240 and 242, the tabs 252, 254, 256 and 258 project in a direction generally transverse to faceplate 202 and towards adapter 22.

When levers 240 and 242 are actuated from their respective open positions to their respective closed positions 248, tabs 252 and 254 of lever 240 are caused to engage on the edge 255 of end plate 132, and tabs 256 and 258 of lever 242 are caused to engage on a mating portion of cross-member 62. Tabs 256 and 258 may be received within notches 260 defined within cross-member 62. As levers 240 and 242 move between their respective open positions 246 and closed positions 248, car 200 is urged to advance farther into shelf 44 toward backplane 54. At this point, I/O port 212 of card 200 is caused to mate with corresponding electrical connector 52 therefor of backplane 54.

It will be understood by those skilled in the art that card insertion actuators 238 operate to reduce the insertion force that is required to connect I/O port 212 of card 200 to electrical connector 52 of backplane 54. The leverage ratio of card insertion actuators 238 is typically 4 to 1, in keeping with the Bellcore standard NEBS GR-78-CORE relating to the insertion forces that may be applied to printed circuit boards.

Figure 14:
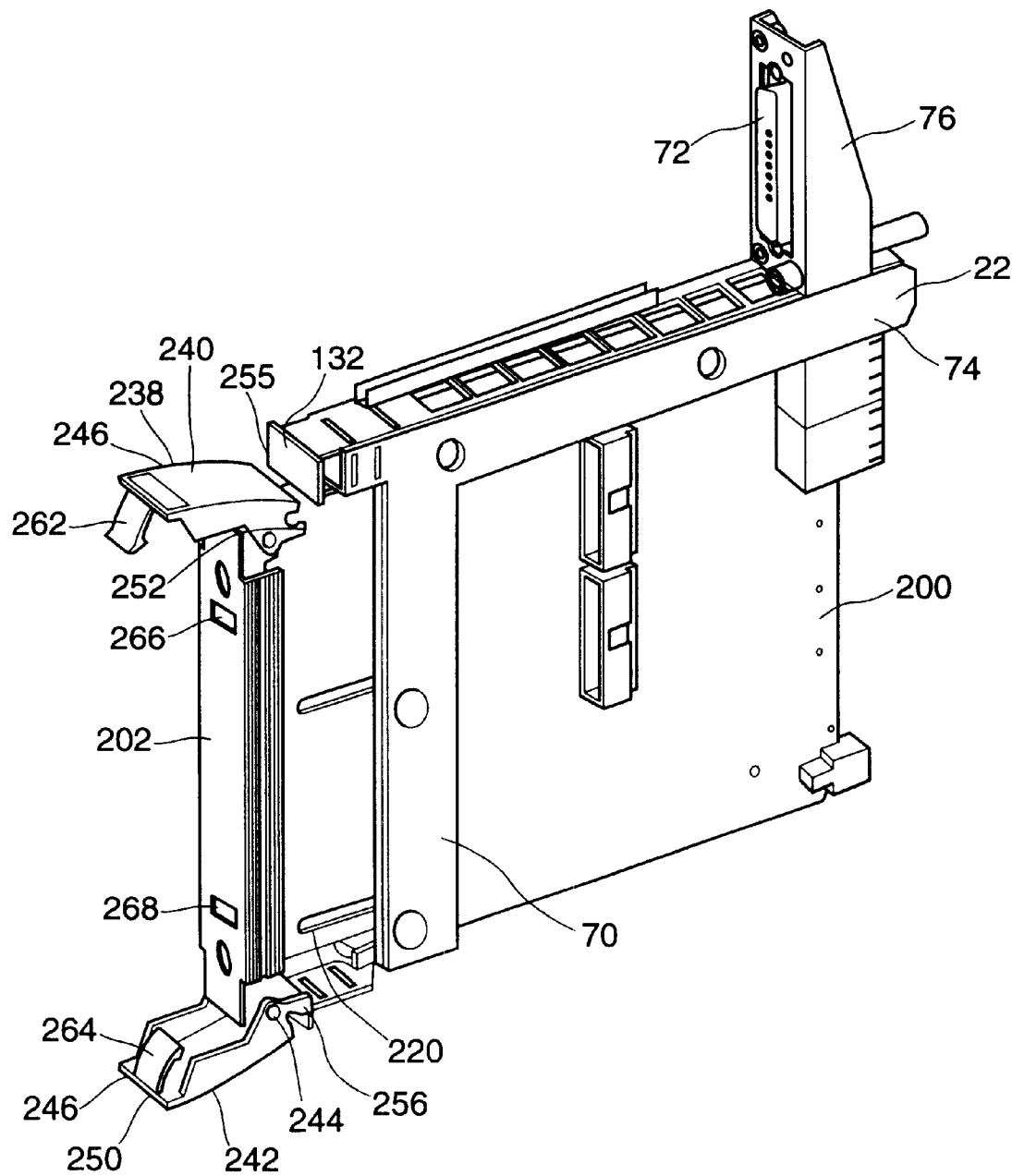
FIG. 14 is another perspective view of the first card assembly shown in the installation of FIG. 1, showing a faceplate thereof having a pair of levers in an open position.

Card insertion actuators 238 may also be provided with locking members 262 and 264 for securing levers 240 and 242 in closed position 248, locking members 262 and 264 shown in open position in FIG. 14. Each locking member 262 and 264 is mounted to extend transversely of the surface of lever 240 and 242, as the case may be, in a direction towards faceplate 202 when levers 240 and 242 are in their respective closed positions 248. The locking members 262 and 264 may each be in the form of a sheet spring with a curved projection found adjacent its free terminal end. Openings 266 and 268 are located on faceplate 202 to receive locking members 262 and 264, respectively. When inserted into the opening 266, 268, each sheet spring of locking members 262 and 264 will respectively be biased to resiliently urge against an edge of the corresponding opening 266, 268 until the curved projections thereof pass theretrough. In this manner, locking members 262 and 264 are engaged within openings 266 and 268 with a snap-fit action.

Figure 15:
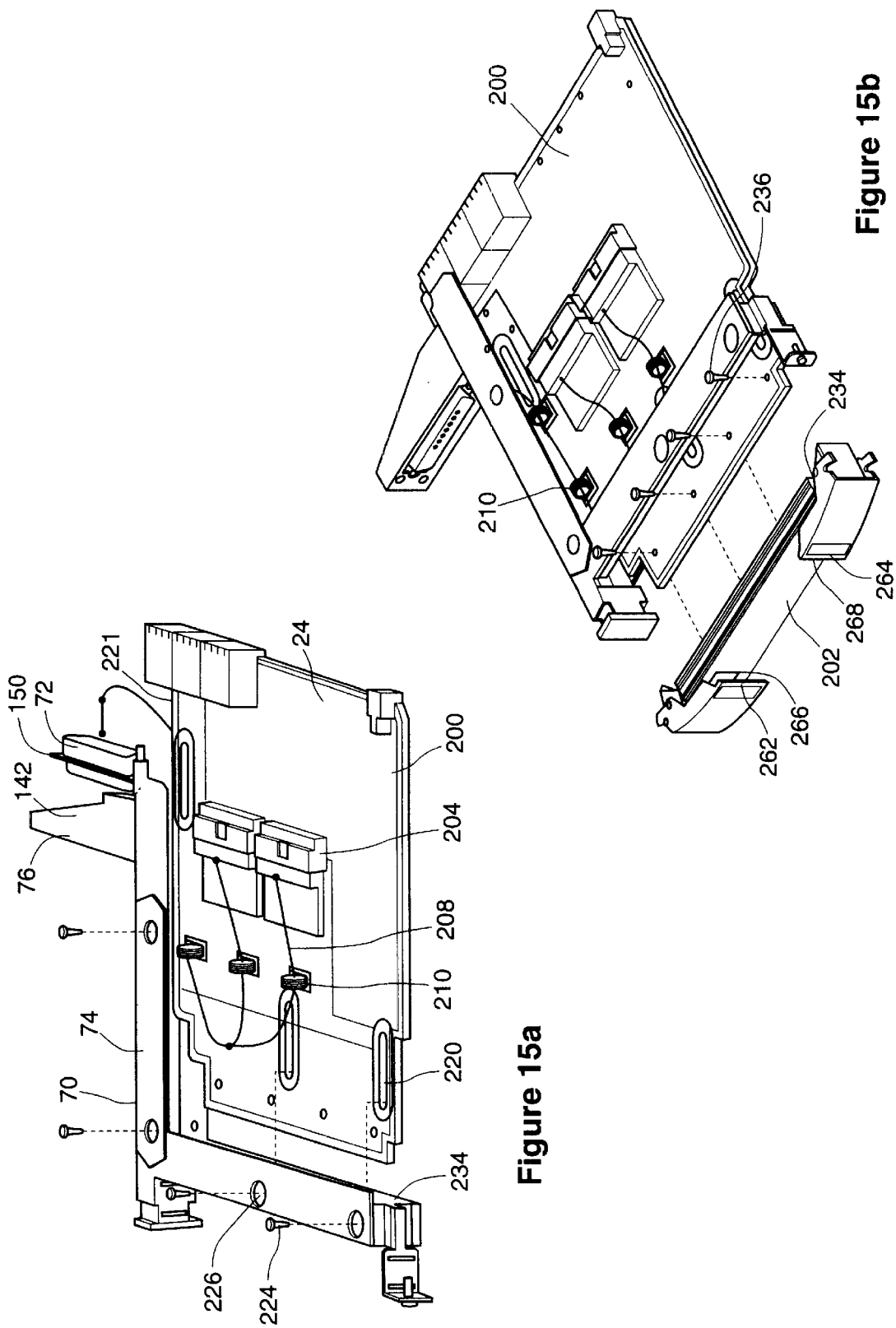
Figure 16:
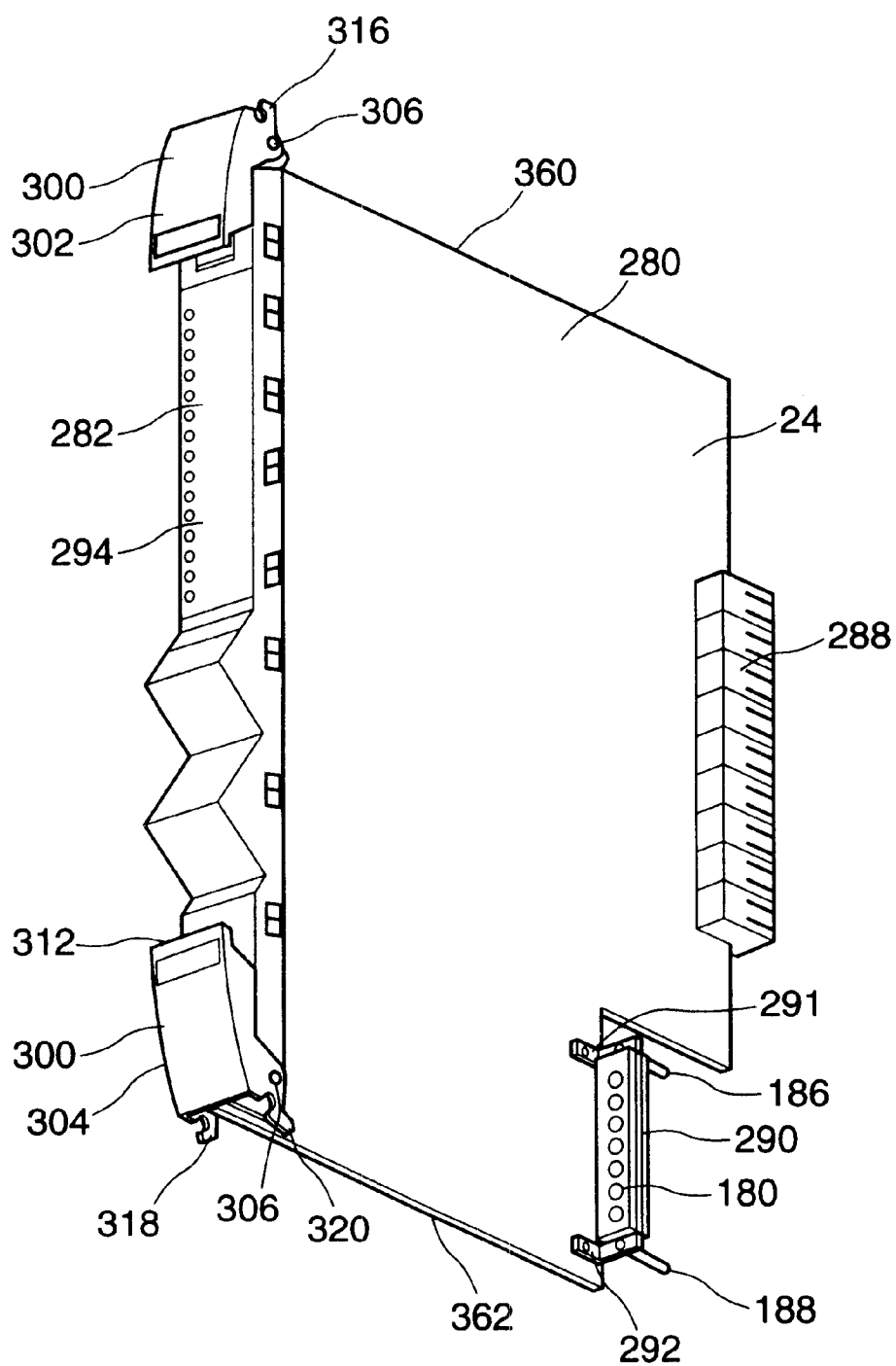
FIG. 16 is a perspective view of the second card assembly shown in the installation of FIG. 4.
Figure 17:
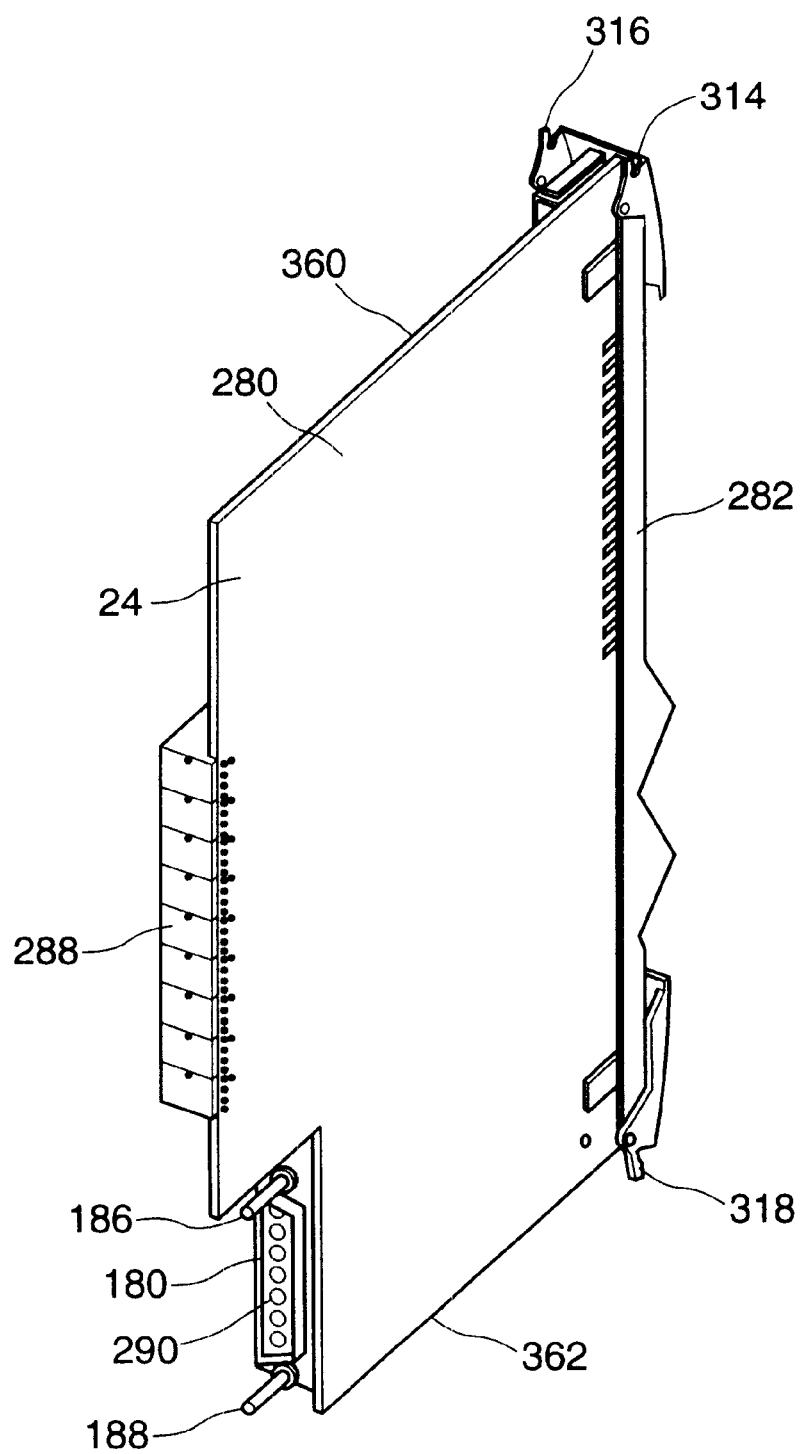
FIG. 17 is another perspective view of the second card assembly of FIG. 16, viewed in a direction generally opposite to that of FIG. 15.
Figure 18:
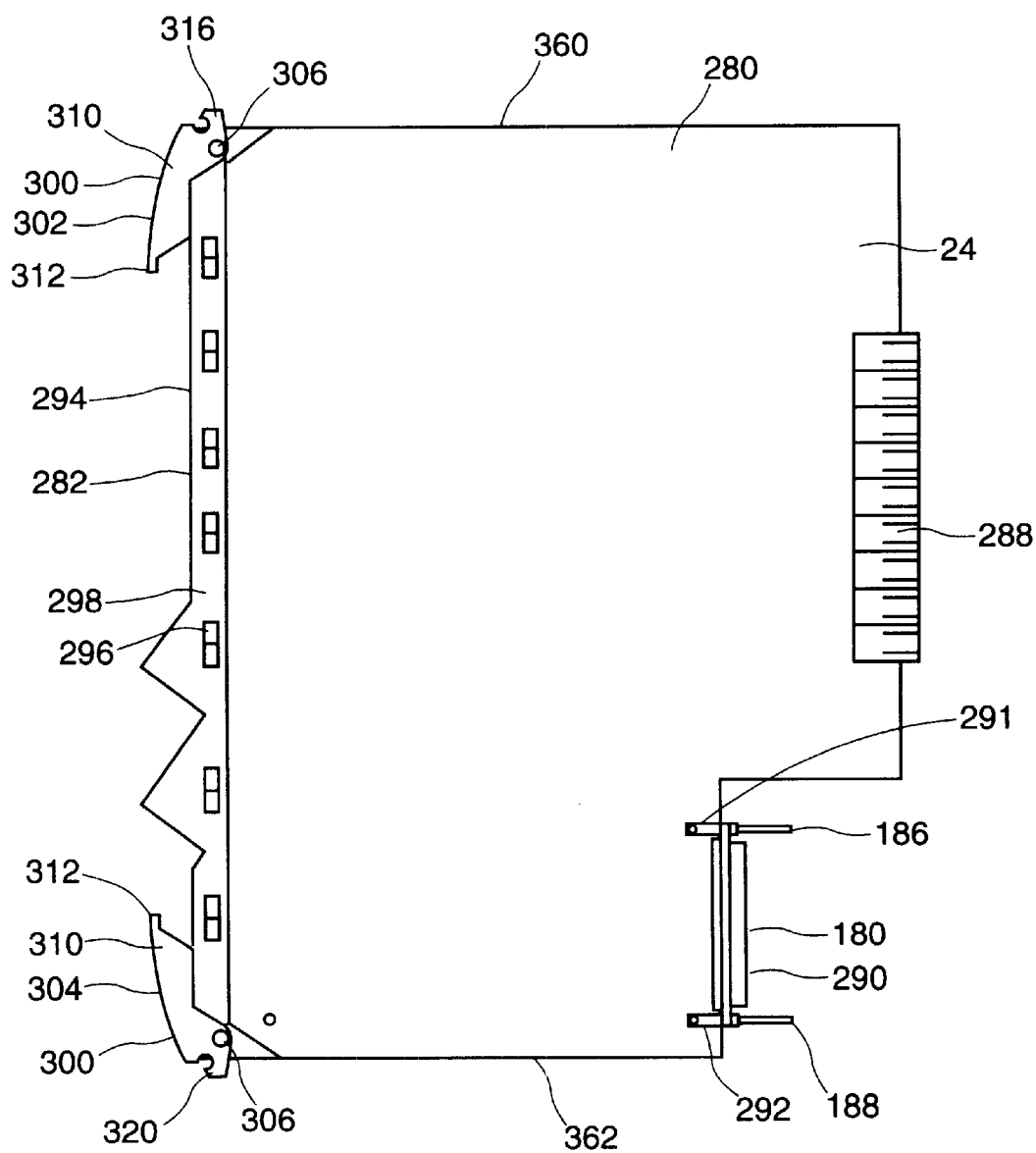
FIG. 18 is a plan view of the second card assembly of FIG. 16.

With reference to FIGS. 15a and 15b, the preferred steps to complete a typical installation of card assembly 26 within adapter 22 are now described. In a typical installation, card 200 is mounted within adapter chassis 70 prior to being fitted with faceplate 202. Wiring of the electrical components 204 is accomplished first. Electrical cables 208 are connected to electrical components 204, passed through cable ties 210, and then connected to the electrical connector 72 at the rear. When wiring electrical connector 72, care is taken to avoid sharp bends in cable 208. Once the wiring operation has been completed, mounting plate 150 holding electrical connector 72 is fastened to channel member 142. Card 200 is then secured to bracket 74. Slots 220 on card 200 are aligned with apertures 226 in bracket 74 and shoulder screws 224 are introduced within slots 220 and fastened, thereby securing card 200 to bracket 74. Once card 200 is mounted within bracket 74, faceplate 202 is secured to card 200 along flange member 234 by fasteners 236. Levers 240 and 242 are then moved to their respective open positions 246 and card assembly 26 in adapter 22 is urged as much as possible through aperture 94 away from mounting arm 76. Cable ties 210 are then tightened about cables 208.

Referring to FIGS. 16 to 20, card assembly 24 comprises a printed circuit board or card 280 and a faceplate 282. Card 280 may be generally L-shaped and carries a plurality of electronic components (not shown). Card 280 also has electrical connectors 288 and 180 mounted adjacent one or more edges thereof for electrical interconnection to electrical connectors 50 of backplane 54 and electrical connector 72 of adapter 22, respectively. Electrical connector 180 is fastened to card 280 by means of brackets 291 and 292 or the like. Electrical connector 180 comprises an input/output (I/O) port 290 and a pair of guide or alignment pins 186 and 188 located on each side of port 290.

A transverse web such as faceplate 282 may be provided adjacent an edge of card 280 that is distal to the edges adjacent to which electrical connectors 180 and 288 have been mounted. Faceplate 282 may be in the form of a longitudinal panel 294 to which card 280 is secured. Faceplate 282 has electromagnetic interference (EMI contacts 296, in the form of resilient fingers, spings or gaskets, similar to contacts 140, mounted along a flange 298 of panel 294 to ensure continuous electrical contact between adjacent shelves 44 and other faceplates 282. Flange 298 is generally disposed transverse to longitudinal panel 294 and extends therefrom in a direction generally towards electrical connector 180.

As is the case with faceplate 202, faceplate 282 also has a pair of card insertion actuators or card ejectors 300; such as levers 302 and 304 mounted at each end of panel 292. Levers 302 and 304 can be made to pivot about an axis 306 that is generally parallel to panel 294 and generally transverse to the plane of card 280, and the levers 302 and 304 are moveable between an open position 308 (shown in FIGS. 19 and 20) and a closed position 310 (shown in FIGS. 16 to 18). Each lever 302 and 304 has a distal or free end 312 that can be grasped to actuate lever 302 and 304, as the case may be. Each lever 302 and 304 also has a pair of spaced-apart tabs 314, 316 and 318, 320, respectively, which are located at the opposite end to free end 312. In the respective open positions 308 of levers 302 and 304, the tabs 314, 316, 318 and 320 project in a direction generally transverse to faceplate 282, as shown in FIGS. 19 and 20.

When levers 302 and 304 are actuated from their respective open positions 308 to their respective closed positions 310, tabs 318 and 320 of lever 304 are caused to engage edge 322 of end plate 132 of adapter 22, and tabs 314 and 316 of lever 302 are caused to engage a portion of cross-member 60. Tabs 314 and 316 may be received within notches 326 defined within cross-member 60. As levers 302 and 304 move between their respective open positions 308 and closed positions 310, card 280 is urged to advance further into shelf 44 toward backplane 54 and guide pins 186 and 188 are inserted into openings 182 and 184 of mounting plate 150. When levers 302 and 304 are in closed position 310, I/O port 290 is caused to mate with electrical connector 72 of adapter 22, and electrical connector 288 is caused to mate with electrical connector 50, simultaneously.

Figure 19:
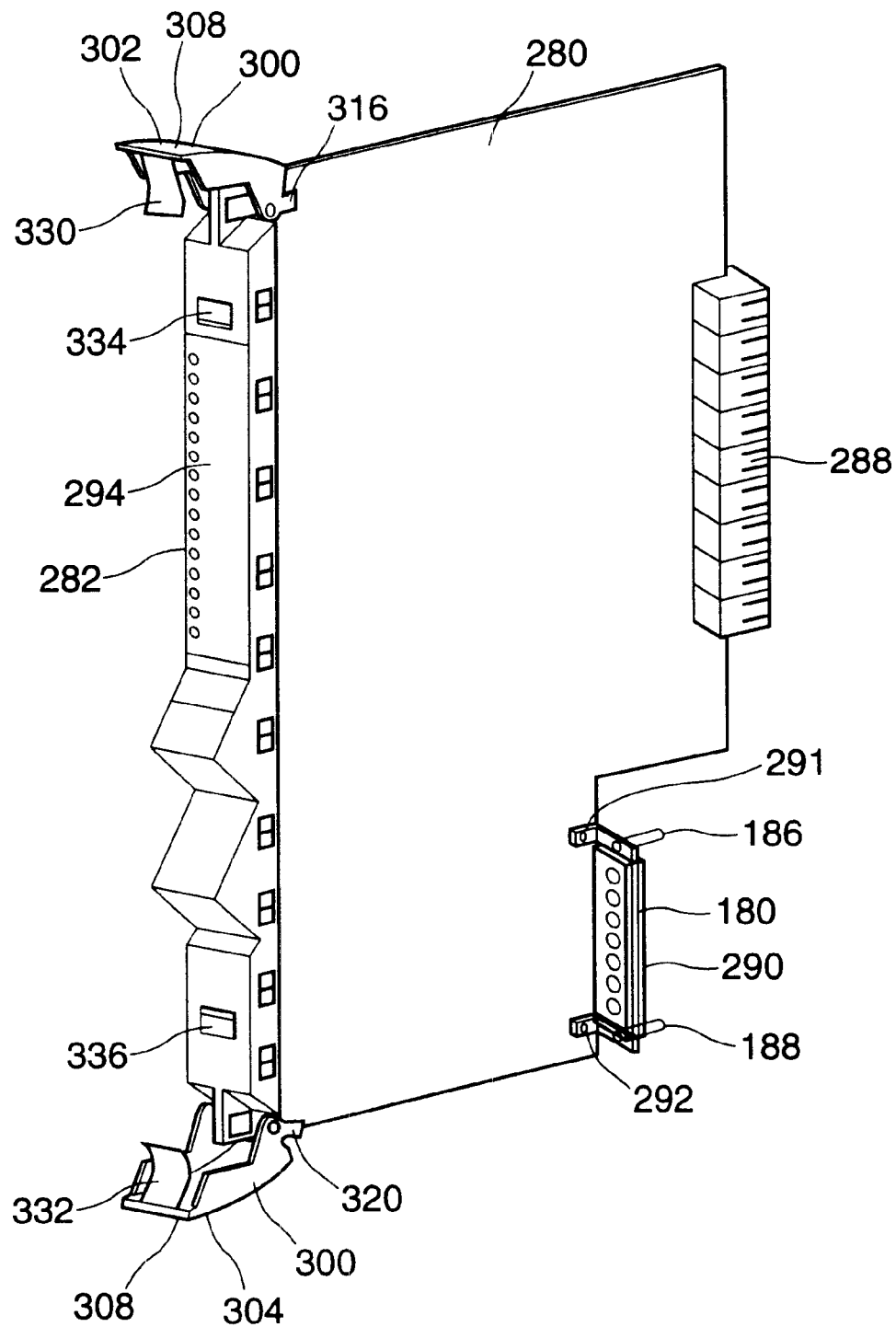
FIG. 19 is another perspective view of the second card assembly shown in the installation of FIG. 4, showing a faceplate thereof having a pair of levers in an open position.
Figure 20:
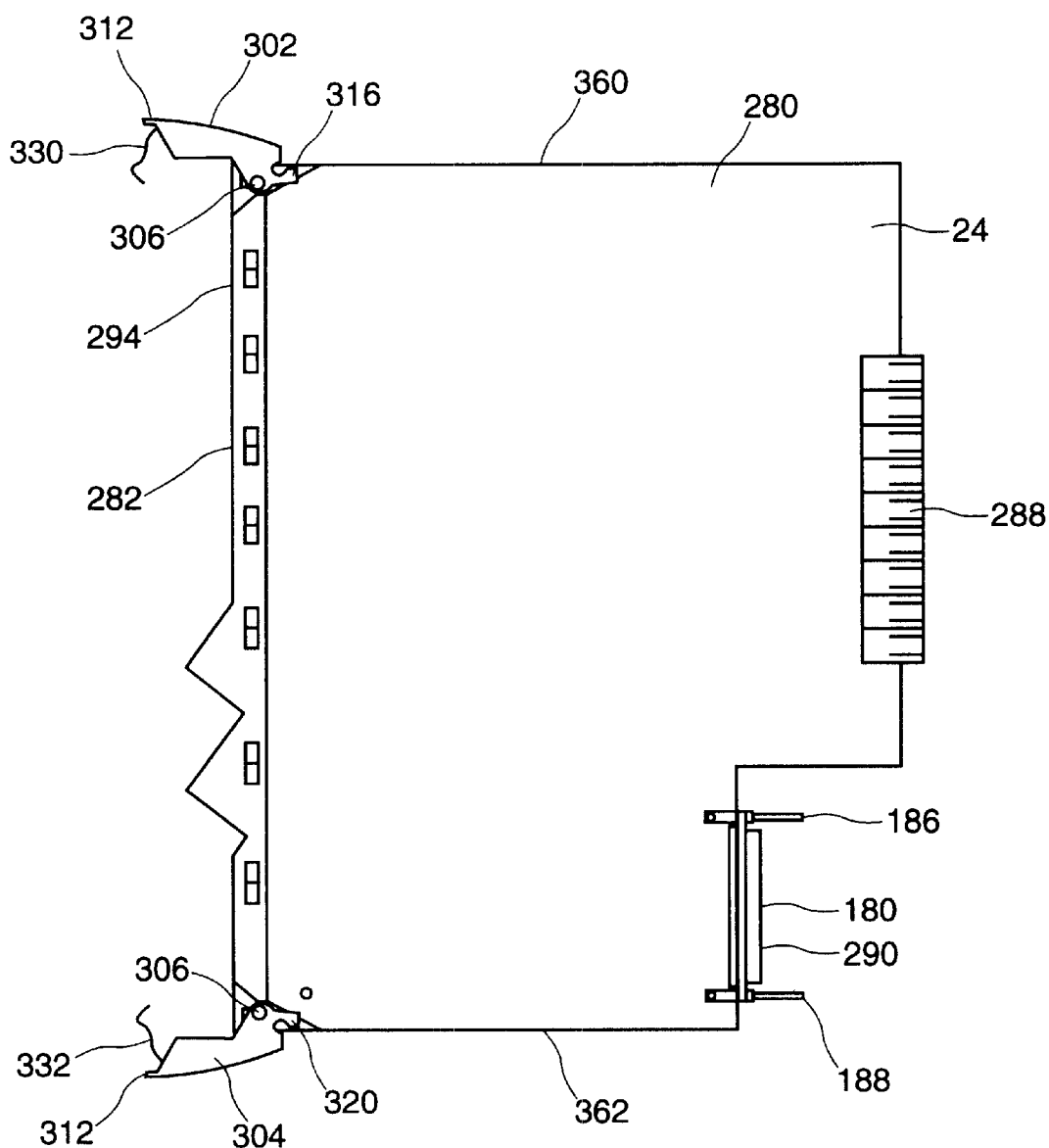
FIG. 20 is a plan view of the second card assembly of FIG. 19.

Card insertion actuators 300 may be provided with locking members 330 and 332 for securing levers 302 and 304 in closed position 310, locking members 330 and 332 shown in an open position in FIG. 19. Each locking member 330 and 332 is mounted to and extends transversely of the surface of lever 302 and 304, as the case may be, in a direction towards faceplate 282 when levers 302 and 304 are in their respective closed positions 310. The locking members 330 and 332 may each be in the form of a sheet spring with a curved projection found adjacent its free teal end, Openings 334 and 336 are located on faceplate 282 to receive locking members 330 and 332, respectively. When inserted into openings 334, 336, each sheet spring of locking members 330 and 332 will respectively be biased to resiliently urge against an edge of the corresponding opening 334, 336 until the curved projections thereof pass theretrough. In this manner, locking members 330 and 332 are engaged within openings 334 and 336 with a snap-fit action.

The preferred steps to complete a typical installation of card assemblies 24 and 26 and adapter 22 within a shelf 44 are now described. In a typical installation, adapter 22 and card assembly 26 (having been assembled in the manner discussed above) are mounted within a shelf 44 prior to installation of card assembly 24. Levers 240 and 242 on faceplate 202 are moved to their respective open positions 246 and card 200 pulled through aperture 94 in a direction away from mounting arm 76. Levers 240 and 242 are then pivoted to their respective closed positions 248 and locking members 262 and 264 are engaged within openings 266 and 268, respectively. Card assembly 26 and adapter 22 can now be mounted to shelf 44.

Chassis 70 may be oriented with mounting arm 76 pointing towards panel 34 of housing 30. In this orientation, edge 350 of card 200 is aligned wit guide 48 of shelf 44. Adapter 22 and card assembly 26 are then inserted into shelf 44 toward backplane 54 with edge 350 engaging guide 48. During such insertion, said guide 48 will also be abutted by foot 98 of corrugated member 96. Chassis 70 is caused to advance into shelf 44 until alignment member 190 is received in opening 196 of backplane stiffening bar 58 and lip 102 of projection 100 abuts cross-member 62. Once bushing 194 is engaged within opening 196, fastener 192 is tightened, thereby securing chassis 70 to backplane stiffening bar 58. Chassis 70 is then secured to cross-member 62 by tightening screw 110. In this way, adapter 2Z is attached to housing 30 by a first fastener or the like, for instance, in the form of fastener 192, and a second fastener or the like, for instance, in the form of screw 110. These fasteners tend to ensure that adapter 22 is rigidly secured and afforded only a narrow tolerance for movement within shelf 44. As a result, adaptor 22 is intended to withstand the insertion forces that may be encountered for electrical interconnection between card assembly 26 and backplane 54 and provides a fixed locating reference for card assembly 24, as will be explained below.

At this point in the installation procedure, I/O port 212 and electrical connector 214 of card 200 have not yet been made with their counterpart connectors of backplane 54. The electrical interconnection of card 200 and backplane 54 is now explained. Locking members 262 and 264 are disengaged and levers 240 and 242 are moved from their respective closed positions 248 to their respective open positions 246. Faceplate 202 is advanced Tither into chassis 70 until tabs 252 and 254 of lever 240 engage on edge 255 of end plate 132 of bracket 74 and tabs 256 and 258 of lever 242 engage on cross-member 62. At this stage, levers 240 and 242 are next moved to their respective closed positions 248, thereby urging card 200 to be inserted further into backplane 54. Pin 59 of connector 56 first mates to electrical connector 214. Then I/O port 212 of card 200 is caused to mate with corresponding electrical connector 52 of backplane 54. Locking members 262 and 264 are then engaged in the manner previously described, thereby holding card assembly 26 fixedly within shelf 44.

Having installed the adapter 22 and secured the electrical interconnection of card 200 to backplane 54, the next installation step involves mounting card assembly 24 in shelf 44. Levers 302 and 304 thereof are moved to their respective open positions 308. Card assembly 24 is oriented such that the edge 360 thereof is aligned with guides 46 of shelf 44 and edge 362 thereof is aligned with guide 136 of bracket 74. Card assembly 26 is then inserted in shelf 44 toward backplane 54 with edges 360 and 362 engaging guides 46 and 136. Card assembly 26 is caused to advance until tabs 318 and 320 of lever 304 engage on edge 322 of end plate 132, and tabs 314 and 316 of lever 302 engage on cross-member 60. Levers 302 and 304 are then moved to their respective closed positions 310 thereby urging card 280 to be inserted further into backplane 54. Guide pins 186 and 188 are inserted into openings 182 and 184 of mounting plate 150. Simultaneously, I/O port 290 is caused to mate with electrical connector 72 of adapter 22, and electrical connector 288 is likewise mated to electrical connector 50. Locking members 330 and 332 are then engaged in the manner previously described, to hold card assembly 24 securely within shelf 44.

In the illustrative embodiment of the invention, card assembly 24 may be designed for use with the 36170

MainSreet™ ATMnet™ Backbone Switch, which is ATM (Asynchronous Tramission Mode) network switching equipment manufactured by Alcatel Networks Corporation of Kanata, Ontario. The 36170 MainStreet™ system comprises at least one housing. The 36170 MainStreet™ housing resembles housing 30, but is actually smaller than the latter in that it provides a smaller shelf configuration. The shelf configuration of the 36170 MainStreet™ housing accommodates printed circuit boards or cards which measure 30.5 cm×23,9 cm (12 inches×9.4 inches). In the illustrative embodiment of the invention, card 280 of card assembly 24 is an ATM interface card having those dimensions.

In the illustrative embodiment of the invention, housing 30 may be the 350 Integrated Versatile Services Node (IVSN)™ manufactured by Alcatel Networks Corporation of Kanata, Ontario and used in ATM (Asynchronous Transmission Mode) network switching equipment. As compared to the 36170 MainStreet™ housing, the housing 30 is modified to provide a larger shelf configuration to accommodate 20-inch high interface cards. The larger shelf configuration provided for in housing 30 permits larger board areas for increased port density and functionality.

In the illustrative embodiment of the invention, "legacy" card 280 is made compatible for use in the larger shelf configuration of housing 30 by way of adapter 22 and card assembly 26. In effect, adapter 22 functions as a mechanical spacer to allow fitting of the "legacy" card 280 in the expanded shelf configuration of housing 30 of the 350 IVSN™ equipment. In the illustrative embodiment of the invention, card 200 of card assembly 26 is essentially a spacer card which is functionally transparent to "legacy" card 280. Electrical connector 72 of adapter 22 and I/O port 212 of card 200 allow the I/O pinouts of the "legacy" card 280 to be re-mapped to match the I/O pinouts of the new larger cards designed for use in 350 IVSN™ equipment. As a result, "legacy" card 280 can be used with equipment forming part of a 350 IVSN™ system.

Although the above description has been made with reference to equipment in the nature of telecommunications switching equipment, those skilled in the art will appreciate that other types of electrical or electronic equipment may be used in conjunction with various embodiments of the invention. It will be likewise understood by those skilled in the art that the foregoing description is made with reference to illustrative embodiments of the invention and that other embodiments employing the principles of the invention may be envisaged, all of which fall within the spirit and scope thereof.

What is claimed is:

1. An apparatus for electrically interconnecting a first circuit substrate with a second circuit substrate, the apparatus comprising:

a first electrical connector which is operatively connected to the first circuit substrate, the first electrical connector mating with a corresponding second electrical connector therefor which is operatively connected to the second circuit substrate;

a longitudinal guide for receiving a first edge of one of the first circuit substrate and the second circuit substrate, said longitudinal guide being positioned adjacent another edge of another one of the first circuit substrate and the second circuit substrate and extending therealong in a direction substantially parallel thereto, such that said first edge and said another edge are not located on a same substrate of said first circuit substrate and said second circuit substrate; and wherein when said first edge of said one of the first circuit substrate and the second circuit substrate is received therein, relative translation of the first circuit substrate with respect to the second circuit substrate directs the first electrical connector and the second electrical connector together to thereby provide electrical engagement therebetween.

2. The apparatus according to claim 1, wherein the longitudinal guide receives a first edge of the second circuit substrate such that when said first edge of the second circuit substrate is received in the longitudinal guide and the first circuit substrate is held stationary, translation of the second circuit substrate with respect to the first circuit substrate directs the second electrical connector towards the first electrical connector to thereby provide said electrical engagement therebetween.

3. The apparatus according to claim 2, wherein each of the first circuit substrate and the second circuit substrate is substantially planar.

4. The apparatus according to claim 3, wherein the longitudinal guide is connected to the first circuit substrates.

5. The apparatus according to claim 4, wherein the longitudinal guide is an elongate channel.

6. The apparatus according to claim 5, wherein the first electrical connector is positioned adjacent a first edge of the first circuit substrate.

7. The apparatus according to claim 6, wherein the first electrical connector is positioned adjacent a terminal end of said longitudinal guide.

8. The apparatus according to claim 7, wherein the second electrical connector is positioned adjacent a second edge of said second circuit substrate which is substantially transverse to said first edge thereof.

9. The apparatus according to claim 8, wherein the first circuit substrate and the second circuit substrate are substantially parallel to each other both during said translation and once said electrical engagement is provided between the first electrical connector and the second electrical connector.

10. The apparatus according to claim 9, wherein the first circuit substrate and the second circuit substrate are substantially coplanar to each other both during said translation and once said electrical engagement is provided between the first electrical connector and the second electrical connector.

11. The apparatus according to claim 9, further comprising a translatable member, wherein the longitudinal guide and the first electrical connector are mounted to said translatable member, the translatable member being connected to the first circuit substrate and being moveable with respect thereto in a direction substantially parallel to said first edge of the first circuit substrate.

12. The apparatus according to claim 11, wherein the translatable member is a frame having a first leg and a second leg depending substantially transversely therefrom, the first leg being disposed adjacent said first edge of the first circuit substrate, the second leg being disposed adjacent a second edge of the first circuit substrate which is substantially transverse to said first edge of the first circuit substrate, the frame being slidably mounted to the first circuit substrate.

13. The apparatus according to claim 12, wherein said first leg and said second leg are respectively substantially parallel to said first edge and to said second edge of the first circuit substrate.

14. The apparatus according to claim 13, wherein the first electrical connector is attached to said frame by means of a mounting arm therefor which substantially transversely depends from said first leg in a direction substantially parallel to the first circuit substrate.

15. The apparatus according to claim 14, wherein the frame comprises pins affixed thereto which extend through corresponding slots provided in the first circuit substrate, said corresponding slots being disposed in a direction substantially parallel to said first edge of the first circuit substrate, the pins being slidable relative to said corresponding slots.

16. The apparatus according to claim 15, wherein the second leg of the frame provides an opening therein through which said first circuit substrate extends.

17. The apparatus according to claim 16, wherein the first electrical connector is affixed to said mounting arm so as to afford a preselected degree of relative movement therebetween.

18. The apparatus according to claim 17, wherein the first electrical connector is affixed to said mounting arm by means of fasteners received in corresponding apertures, the said fasteners and said corresponding apertures being so dimensioned as to result in said relative movement between the first electrical connector and the mounting arm.

19. The apparatus according to claim 18, wherein the first circuit substrate and the second circuit substrate are mountable to an equipment enclosure therefor, the equipment enclosure providing a first longitudinal guide which receives a third edge of said first substrate, said third edge of the first substrate being substantially parallel to said first edge thereof, the equipment enclosure further providing a second longitudinal guide which receives a third edge of said second substrate, said third edge of the second substrate being substantially parallel to said first edge thereof.

20. The apparatus according to claim 19, wherein the equipment enclosure comprises an electrical connector for mating electrical engagement with a third electrical connector that is operatively connected to said first circuit substrate.

21. The apparatus according to claim 20, wherein said third electrical connector is mounted to said first circuit substrate adjacent a fourth edge thereof which is substantially parallel to said second edge thereof.

22. The apparatus according to claim 21, further comprising a first actuator for effecting movement of said translatable member with respect to said first circuit substrate.

23. The apparatus according to claim 22, wherein said first actuator comprises a first lever pivotally mounted adjacent said second edge of said first circuit substrate, said first lever having a terminal end thereof which engages said translatable member, said first lever further having an axis of rotation thereof which is substantially transverse to said first circuit substrate.

24. The apparatus according to claim 23, wherein said first actuator comprises a second lever pivotally mounted adjacent said second edge of said first circuit substrate, said second lever having a terminal end thereof which engages said equipment enclosure, said second lever further having an axis of rotation thereof which is substantially transverse to said first circuit substrate.

25. The apparatus according to claim 24, wherein said first and second levers of said first actuator are mounted to a web which is transversely disposed with respect to the first circuit substrate and which is fixedly attached to said second edge thereof.

26. The apparatus according to claim 25, wherein actuation of said first and second levers of said first actuator causes translation of the first circuit substrate when the third edge thereof is received in the first longitudinal guide of the equipment enclosure to thereby effect mating electrical engagement between said electrical connector of the equipment enclosure and said third electrical connector.

27. The apparatus according to claim 26, wherein the translatable member comprises a locating mechanism for fixedly attaching the translatable member to the equipment enclosure prior to said actuation of said first and second levers.

28. The apparatus according to claim 27, wherein the locating mechanism is a threaded pin which is slidably received in a housing therefor, the threaded pin being disposed substantially parallel to said first edge of the first circuit substrate.

29. The apparatus according to claim 28, wherein the said housing is attached to said mounting arm.

30. The apparatus according to claim 29, further comprising a second actuator for effecting movement of said second circuit substrate with respect to said first circuit substrate.

31. The apparatus according to claim 30, wherein said second actuator comprises a first lever pivotally mounted adjacent a fourth edge of said second circuit substrate, the said fourth edge thereof being substantially parallel to said second edge of the second circuit substrate, said fist lever having a terminal end thereof which engages said translatable member of the first circuit substrate, said first lever further having an axis of rotation thereof which is substantially transverse to said second circuit substrate.

32. The apparatus according to claim 31, wherein said second actuator comprises a second lever pivotally mounted adjacent said fourth edge of said second circuit substrate, said second lever having a terminal end thereof which engages said equipment enclosure, said lever flier having an axis of rotation thereof which is substantially transverse to said second circuit substrate.

33. The apparatus according to claim 32 wherein said first and second levers of said second actuator are mounted to a web which is transversely disposed with respect to the second circuit substrate and which is fixedly attached to said fourth edge thereof.

34. The apparatus according to claim 33, wherein actuation of the first and second levers of the second actuator causes said translation of the second circuit substrate with respect to the first circuit substrate when the first edge of the second circuit substrate has been received in the longitudinal guide of the first circuit substrate, the third edge of the second circuit substrate has been received in the second longitudinal guide of the equipment enclosure, the translatable member has been fixedly attached to the equipment enclosure by means of the locating mechanism, and the fist and second levers of the first actuator have been actuated to effect said mating electrical engagement between said electrical connector of the equipment enclosure and said third electrical connector.

35. The apparatus according to claim 34, wherein the first circuit substrate is substantially rectangular in shape.

36. The apparatus according to claim 35, wherein the second circuit substrate is substantially L-shaped.

37. The apparatus according to claim 1, wherein the first electrical connector affords a preselected degree of relative movement between said first electrical connector and said longitudinal guide, said relative movement resulting from movement of the first electrical connector in a plane which is substantially transverse to the said direction in which said longitudinal guide extends along said edge of said one of the first circuit substrate and the second circuit substrate.

* * * * *